(12) United States Patent
Masuoka et al.

(10) Patent No.: US 8,378,400 B2
(45) Date of Patent: Feb. 19, 2013

(54) SOLID STATE IMAGING DEVICE

(75) Inventors: Fujio Masuoka, Tokyo (JP); Nozomu Harada, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 83 days.

(21) Appl. No.: 13/205,819

(22) Filed: Aug. 9, 2011

(65) Prior Publication Data

US 2012/0104478 A1     May 3, 2012

Related U.S. Application Data

(60) Provisional application No. 61/408,131, filed on Oct. 29, 2010.

(51) Int. Cl.
*H01L 31/0232* (2006.01)
(52) U.S. Cl. ............... 257/292; 257/294; 257/E27.133
(58) Field of Classification Search .................. 257/292, 257/294, 461, E27.133
See application file for complete search history.

(56) References Cited

U.S. PATENT DOCUMENTS

| 7,872,287 B2 * | 1/2011 | Masuoka et al. | 257/291 |
| 8,330,089 B2 * | 12/2012 | Masuoka et al. | 250/208.1 |
| 2011/0215381 A1 * | 9/2011 | Masuoka et al. | 257/229 |
| 2011/0220969 A1 * | 9/2011 | Masuoka et al. | 257/223 |

OTHER PUBLICATIONS

Agranov, G., "Pixel continues to shrink . . . Pixel Development for Novel CMOS Image Sensors," ITE Technical Report, vol. 33, No. 38, pp. 9-12, Sep. 2009.
Wuu, S.G. et al., "A Leading-Edge 0.9 μm Pixel CMOS Image Sensor Technology with Backside Illumination: Future Challenges for Pixel Scaling (Invited)," IEDM2010 Digest Papers, 14.1.1-14.1.4 2010.

\* cited by examiner

*Primary Examiner* — Minh-Loan T Tran
(74) *Attorney, Agent, or Firm* — Brinks Hofer Gilson & Lione

(57) ABSTRACT

An island-shaped semiconductor constituting a pixel includes a first semiconductor $N^+$-region formed on a substrate, a second semiconductor P-region formed on the region, third semiconductor N-regions formed on upper lateral sides of the region, insulating layers formed on the outer periphery of the regions and lower lateral sides of the region, gate conductive layers formed on the outer periphery of the insulating layers and functioning as gate electrodes forming a channel in a lower area of the region, light-reflection conductive layers formed on the outer periphery of the N regions and a portion of the insulating layers where the gate conductive layers are not formed, a fifth semiconductor $P^+$-region formed on the region and the regions, and a microlens formed on the region and whose focal point is located near the upper surface of the region.

11 Claims, 26 Drawing Sheets

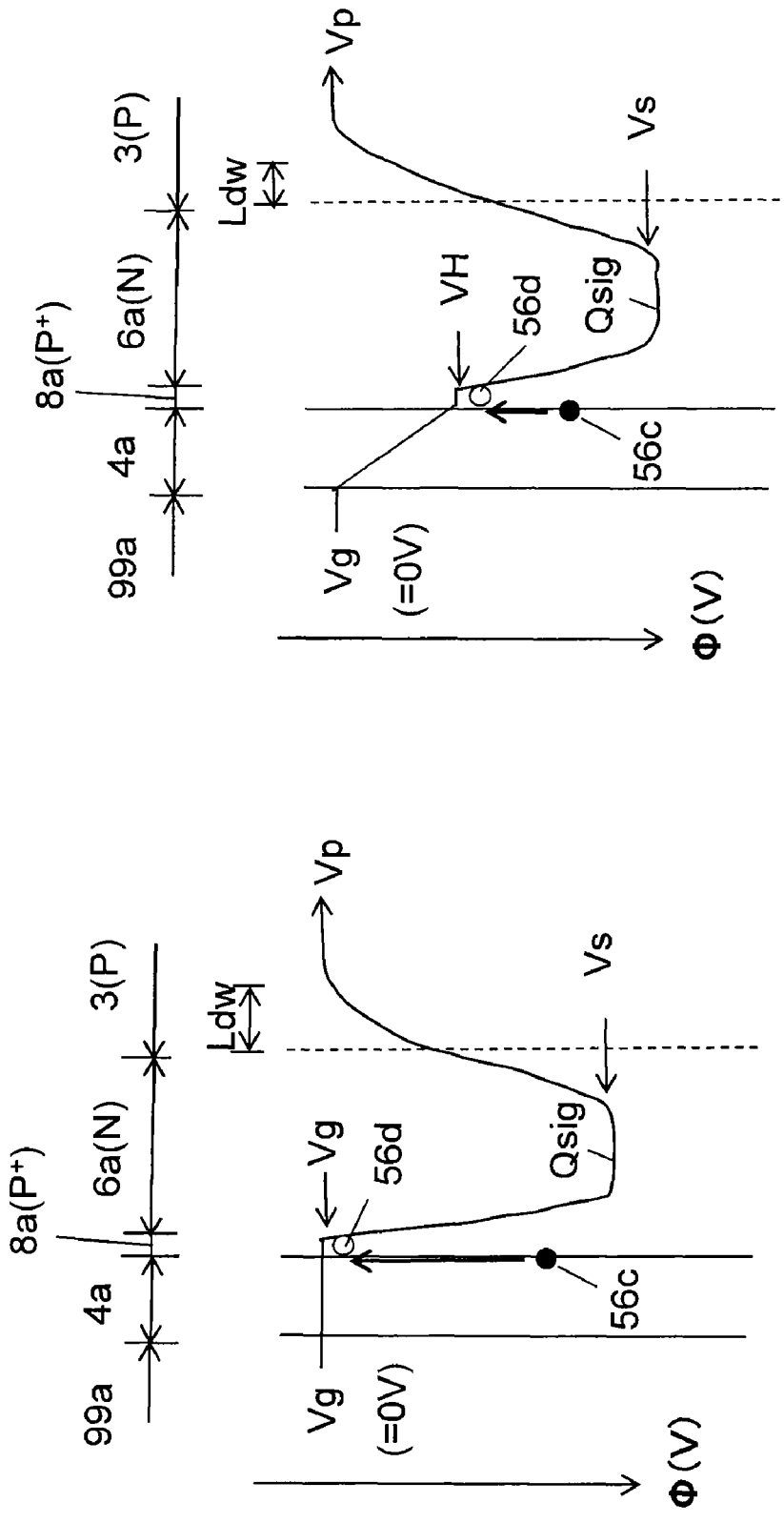

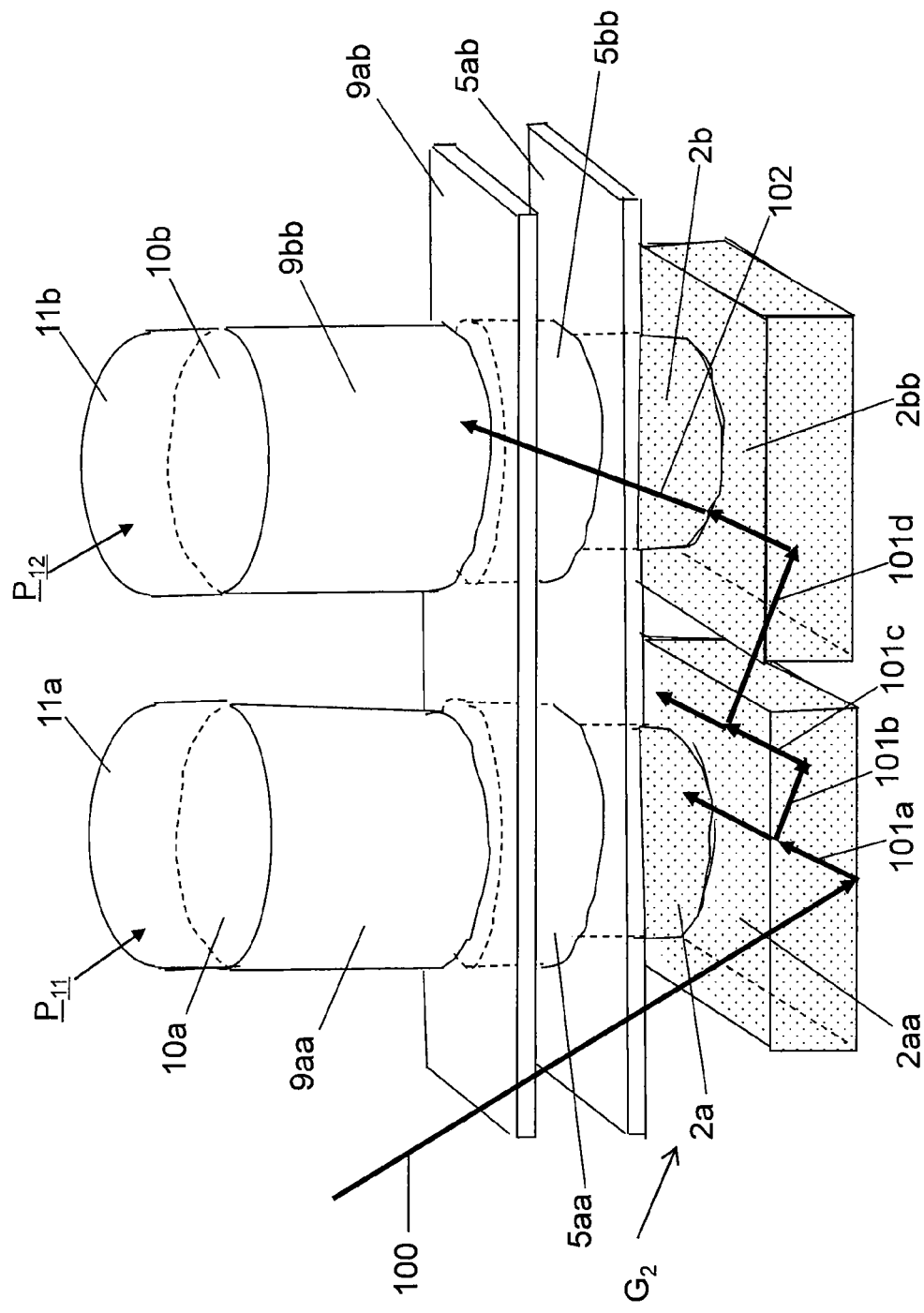

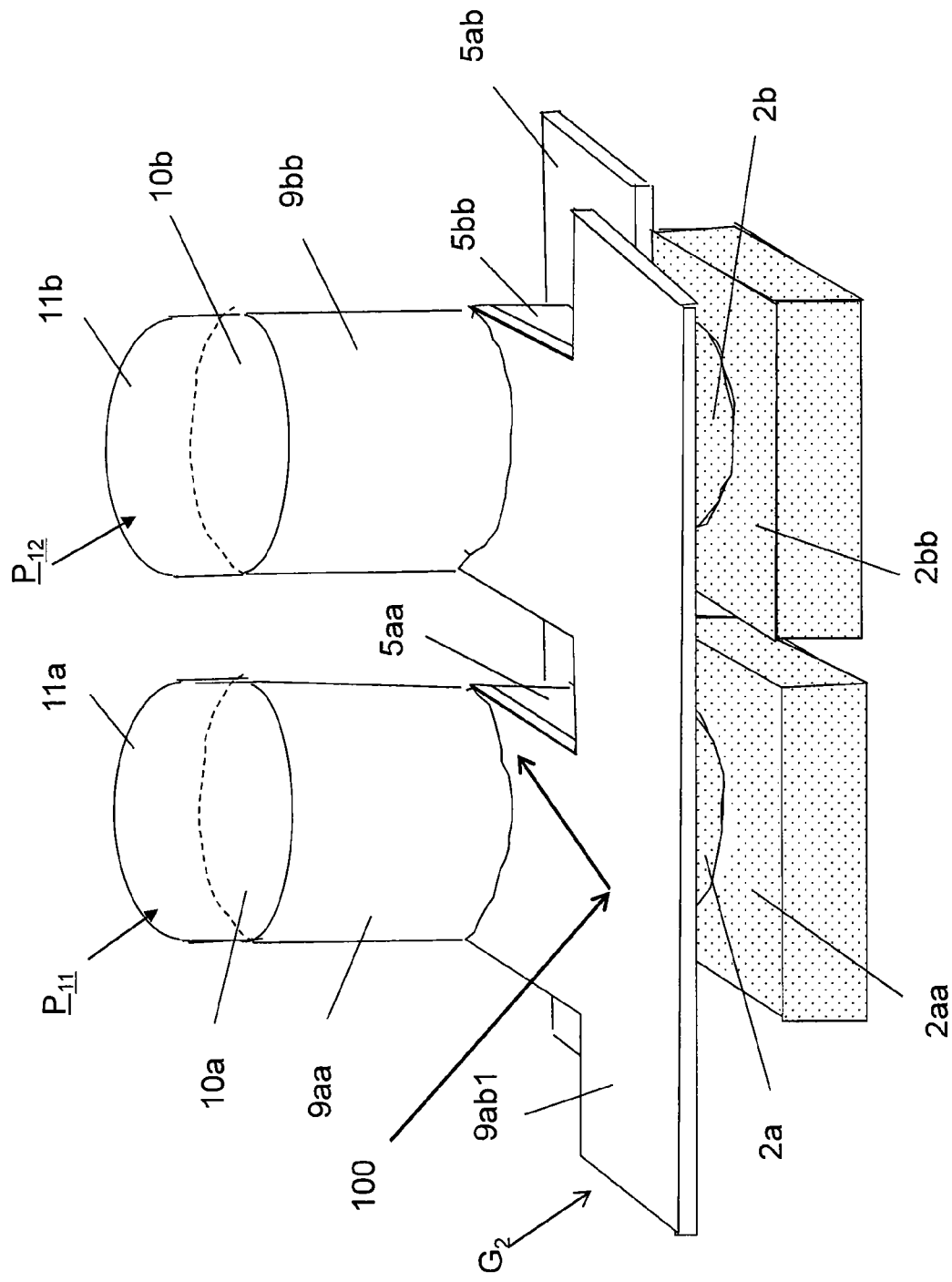

SOLID STATE IMAGING DEVICE

RELATED APPLICATIONS

This application claims the benefit of the filing date of U.S. Provisional Application Ser. No. 61/408,131 filed on Oct. 29, 2010 pursuant to 35 U.S.C. §119(e). The entire content of this application is hereby incorporated by reference.

BACKGROUND OF THE INVENTION

1. Field of the Invention

The present invention relates to solid-state imaging devices, and more particularly, to a solid-state imaging device that achieves a higher pixel density, a higher resolution, less color mixture, and a higher sensitivity.

2. Description of the Related Art

At present, CCDs and CMOS solid-state imaging devices are widely used in video cameras, still cameras, and the like. Performance improvements in solid-state imaging devices, such as an increase in the pixel density, an increase in the resolution, a reduction in color mixture in color imaging, and an increase in the sensitivity, are always demanded. Under such circumstances, in order to realize a higher resolution of solid-state imaging devices, technological innovation such as an increase in the pixel density has been made.

FIGS. 12A to 12B and FIG. 13 illustrate solid-state imaging devices of related art.

FIG. 12A illustrates a cross-section diagram of a solid-state imaging device of an example of related art in which one pixel includes a single island-shaped semiconductor 30 (for example, see Patent Document 1). As illustrated in FIG. 12A, in the island-shaped semiconductor 30 constituting the pixel, a signal line semiconductor $N^+$-region 31 (hereinafter, a "semiconductor $N^+$-region" represents a semiconductor region containing a large amount of donor impurities) is formed on a substrate, which is not illustrated in the drawing. A semiconductor P-region 32 (hereinafter, a "semiconductor P-region" represents a semiconductor region containing acceptor impurities) is formed on the signal line semiconductor $N^+$-region 31. Insulating layers 33a and 33b are formed on the outer periphery of the semiconductor P-region 32, and gate conductive layers 34a and 34b are formed on the outer periphery of the semiconductor P-region 32 with the insulating layers 33a and 33b therebetween. On the outer periphery of the semiconductor P-region 32 above the gate conductive layers 34a and 34b, semiconductor N-regions 35a and 35b (hereinafter, a "semiconductor N-region" represents a semiconductor region containing donor impurities) are formed. On the semiconductor N-regions 35a and 35b and the semiconductor P-region 32, a semiconductor $P^+$-region 36 (hereinafter, a "semiconductor $P^+$-region" represents a semiconductor region containing a large amount of acceptor impurities) is formed in an upper area of the island-shaped semiconductor 30. The semiconductor $P^+$-region 36 is connected to pixel-selecting lines 37a and 37b. The insulating layers 33a and 33b are connected to each other so as to surround the outer periphery of the island-shaped semiconductor 30. Similarly, the gate conductive layers 34a and 34b are connected to each other so as to surround the outer periphery of the island-shaped semiconductor 30, and the semiconductor N-regions 35a and 35b are also connected to each other so as to surround the outer periphery of the island-shaped semiconductor 30.

Regarding the island-shaped semiconductor 30, light, which is one type of electromagnetic energy wave, is applied from the side of the semiconductor $P^+$-region 36 on the upper surface of the island-shaped semiconductor 30. In the island-shaped semiconductor 30, a photodiode region including the semiconductor P-region 32 and the semiconductor N-regions 35a and 35b is formed. Due to this light exposure, signal charges (here, free electrons) are generated in a photoelectric conversion region in the photodiode region. The generated signal charges are stored in the semiconductor N-regions 35a and 35b in the photodiode region. In addition, in the island-shaped semiconductor 30, a junction transistor is formed in which the semiconductor N-regions 35a and 35b serve as a gate, the semiconductor $P^+$-region 36 serves as a source, and a portion of the semiconductor P-region 32 near the signal line semiconductor $N^+$-region 31 serves as a drain. The drain-source current (output signal) of the junction transistor varies in accordance with the amount of signal charges stored in the semiconductor N-regions 35a and 35b and is read to the outside by being extracted outside from the signal line semiconductor $N^+$-region 31. Furthermore, in the island-shaped semiconductor 30, a MOS transistor is formed in which the semiconductor N-regions 35a and 35b of the photodiode region serve as a source, the gate conductive layers 34a and 34b serve as a gate, the signal line semiconductor $N^+$-region 31 serves as a drain, and a portion of the semiconductor P-region 32 between the semiconductor N-regions 35a and 35b and the signal line semiconductor $N^+$-region 31 serves as a channel. When a plus-on voltage is applied to the gate conductive layers 34a and 34b of the MOS transistor, the signal charges stored in the semiconductor N-regions 35a and 35b are discharged to the signal line semiconductor $N^+$-region 31.

The basic operation of the solid-state imaging device includes: a signal charge storing operation for storing into the semiconductor N-regions 35a and 35b signal charges generated in the photoelectric conversion region (photodiode region) by exposure to light beams that are incident from the upper surface of the island-shaped semiconductor 30 in a state where a ground voltage (0 V) is applied to the signal line semiconductor $N^+$-region 31, the gate conductive layers 34a and 34b, and the semiconductor $P^+$-region 36; a signal charge reading operation for reading as a signal current a source-drain current of the junction transistor that is modulated by the potential of the semiconductor N-regions 35a and 35b changed in accordance with the amount of stored signal charges in a state where the ground voltage is applied to the signal line semiconductor $N^+$-region 31 and the gate conductive layers 34a and 34b and a plus voltage is applied to the semiconductor $P^+$-region 36; and a reset operation for, after the signal charge reading operation, discharging the signal charges stored in the semiconductor N-regions 35a and 35b to the signal line semiconductor $N^+$-region 31 in a state where the ground voltage is applied to the semiconductor $P^+$-region 36 and the plus voltage is applied to the gate conductive layers 34a and 34b and the signal line semiconductor $N^+$-region 31.

FIG. 12B illustrates the relationship of the optical absorption intensity I with respect to the Si (silicon) depth (μm) from the light exposure surface of the exposure light wavelength λ for blue light (λ=400 nm), green light (λ=550 nm), red light (λ=700 nm), and infrared light (λ=870 nm). When the optical absorption intensity I is normalized against the optical absorption intensity $I_0$ on the exposure surface, the normalized value $I/I_0$ is reduced against the light penetration depth in an exponential manner. FIG. 12B illustrates that most of blue light is absorbed at a depth of approximately 1 μm; however, green light reaches a depth of 5 μm, red light reaches a depth of 10 μm or more, and signal charges are generated at the depths where the green light and the red light reach. In actual solid-state imaging devices, for example, as described in Non-Patent Document 1, it is required that the depth of a light-sensitive region be set to 2.5 to 3 µm so that 80 percent of green light can be absorbed.

The photoelectric conversion region in the solid-state imaging device illustrated in FIG. 12A is a photodiode region formed by the semiconductor P-region 32 and the semiconductor N-regions 35a and 35b. Thus, due to the reason described above, the height Ld of the photodiode region is required to be 2.5 µm to 3 µm. At present, regarding commercialized solid-state imaging devices, the minimum pitch of two-dimensionally arranged pixels is 1.4 µM. Furthermore, a pitch of 0.9 µM has also been released (see, for example, Non-Patent Document 2). Further reduction in the pixel pitch is demanded. Moreover, since reducing the distance between island-shaped semiconductors 30 constituting pixels adjacent to each other improves the light reception rate which represents how efficiently a light beam is received in the photodiode region and improves the sensitivity of the solid-state imaging device, a reduction in the distance between adjacent island-shaped semiconductors 30 is also demanded. In a case where 0.2 µm (200 nm) is set based on a design rule, normally, processing is performed so that the distance between adjacent island-shaped semiconductors 30 is set as close as possible to 0.2 µm. In this case, the aspect ratio for island-shaped semiconductors (the ratio of the depth to the distance between adjacent island-shaped semiconductors) is 12.5 to 15 or 15 or more. That is, it is required to form the gate conductive layers 34a and 34b of the MOS transistor in a narrow and deep recess formed between island-shaped semiconductors 30. Furthermore, the signal line semiconductor $N^+$-region 31 is required to be formed at the bottom of the island-shaped semiconductor 30. It is therefore difficult to manufacture such solid-state imaging devices. As described above, since the height Ld of the photodiode region is required to be set to 2.5 to 3 µm in the island-shaped semiconductor 30 forming the solid-state imaging device, increases in the pixel density and the sensitivity of the solid-state imaging device are difficult to achieve. Consequently, a technique for reducing the height Ld of the photodiode region without reducing the sensitivity of the solid-state imaging device is demanded.

In addition, at the actual time of imaging, a light beam 38 that is diagonally incident to the island-shaped semiconductor 30, which is a pixel, as illustrated in FIG. 12A, is also incident to the photodiode region of an island-shaped semiconductor 30 adjacent to the island-shaped semiconductor 30 constituting the pixel. Due to a reduction in the light collection ratio in the pixel, signal charges that should be generated in the island-shaped semiconductor 30 constituting one pixel are generated in island-shaped semiconductors 30 constituting peripheral pixels in a distributed manner. Thus, the resolution of the solid-state imaging device is reduced and color mixture in color imaging occurs. Such a problem becomes greater as the pixel density increases.

In addition, a technique exists in which, in order to prevent the light collection ratio from being reduced, metallic walls 39a and 39b are arranged above a photodiode region 41 in a semiconductor device, as illustrated in FIG. 13 (see, for example, Patent Document 2). In this pixel structure, the photodiode region 41 is formed inside a semiconductor substrate 40, and a component isolation region 42 and source and drain regions 43a and 43b of a MOS transistor are formed around the photodiode region 41. Inside a first inter-layer insulating layer 44 formed on the semiconductor substrate 40, a gate electrode 45 of the MOS transistor, a contact hole 46a, and the metallic walls 39a and 39b surrounding the photodiode region 41 are formed. A second inter-layer insulating layer 47 is formed on the first inter-layer insulating layer 44. Furthermore, an $SiO_2$ film 48, an SiN film 49, and a microlens 50 are formed in that order on the second inter-layer insulating layer 47. Contact holes 46b and 46c for circuit wiring are formed inside the second inter-layer insulating layer 47 and metallic wires 51a, 51b, 51c, and 51d are formed on the second inter-layer insulating layer 47.

In the semiconductor device, light beams 52a, 52b, 52c, and 52d transmitted through the microlens 50 are reflected by the metallic walls 39a and 39b and are incident to the photodiode region 41. Thus, the light collection ratio for light beams incident from the microlens 50 to the photodiode region 41 can be improved. However, since the incident light beams are diagonally incident to the surface of the photodiode region 41, part of the light beams 53a, 53b, 53c, and 53d incident to the photodiode region 41 leaks to pixels adjacent to the pixel of interest.

As other techniques for improving the light collection ratio in one pixel, a technique in which a metallic wall is arranged inside a color filter layer formed between a microlens and a photodiode region (see, for example, Patent Document 3), a technique in which a light guide is formed above a photodiode region (see, for example, Patent Document 4), and the like are known. However, even in these techniques, since an incident light beam is diagonally incident to the surface of the photodiode region, part of the light beam incident to the photodiode region leaks to a pixel adjacent to the pixel of interest.

RELATED ART

Patent Documents

[Patent Document 1] International Publication No. 2009/034623
[Patent Document 2] United States Patent Application Publication No. 2008/0185622 (A1)
[Patent Document 3] United States Patent Application Publication No. 2009/0101946 (A1)
[Patent Document 4] United States Patent Application Publication No. 2008/0145965 (A1)

Non-Patent Documents

[Non-Patent Document 1] G. Agranov, R. Mauritzson, J. Ladd, A. Dokoutchaev, X. Fan, X. Li, Z. Yin, R. Johnson, V. Lenchenkov, S. Nagaraja, W. Gazeley, J. Bai, H. Lee, Yoshinori Takizawa, "Reduction in Pixel Size and Characteristic Comparison of CMOS Image Sensor (CMOS Imeeji Sensa no Gaso Saizu Shukushou to Tokusei Hikaku)", Technical Report, The Institute of Image Information and Television Engineers, Vol. 33, No. 38, pp. 9-12 (September 2009)
[Non-Patent Document 2] S. G. Wuu, C. C. Wang, B. C. Hseih, Y. L. Tu, C. H. Tseng, T. H. Hsu, R. S. Hsiao, S. Takahashi, R. J. Lin, C. S. Tsai, Y. P. Chao, K. Y. Chou, P. S. CHOU, H. Y. Tu, F. L. Hsuch, L. Tran; "A Leading-Edge 0.9 Pixel CMOS Image Sensor Technology with Backside Illumination: Future Challenges for Pixel Scaling", IEDM2010 Digest Papers, 14.1.1 (2010)

The solid-state imaging device illustrated in FIG. 12A is suitable for achieving a higher pixel density since one pixel is formed of one island-shaped semiconductor 30. Thus, by applying advanced fine processing technology, a higher pixel density in the pixel size on the plane viewed from the light exposure surface can be achieved. However, when the conditions of optical absorption described in Non-Patent Document 1 are applied, according to the graph of FIG. 12B, in a case where the island-shaped semiconductor is formed of Si, 2.5 to 3 µm is required for the height Ld of the photodiode region. The height Ld required for the photodiode region is not changed even when the pixel density increases. In addition, in order to improve the sensitivity, a reduction in the distance between the island-shaped semiconductors 30 is demanded. Thus, processing is required to be performed so that a high aspect ratio (the ratio between the distance between the island-shaped semiconductors 30 and the height of the photodiode region) can be achieved for adjacent island-shaped semiconductors. Therefore, since the gate conductive layers 34a and 34b of the MOS transistor are formed in a narrow and deep recess formed between the island-shaped semiconductors 30 and the signal line semiconductor $N^+$-region 31 is formed at the bottom of the island-shaped semiconductor 30, a difficulty in manufacturing occurs. Accordingly, the fact that it is difficult to form such a pixel structure including the island-shaped semiconductor 30 makes it difficult to increase the pixel density and the sensitivity of a solid-state imaging device. Therefore, for solid-state imaging devices, a technique for reducing the height Ld of a photodiode region without reducing the sensitivity is demanded.

In addition, as described above, in the solid-state imaging device of related art, the light beam 38 diagonally incident to the island-shaped semiconductor 30 constituting a pixel may be incident to the diode region of an island-shaped semiconductor 30 adjacent to the island-shaped semiconductor 30 of interest. Due to the reduction in the light collection ratio within the island-shaped semiconductor 30 constituting one pixel, signal charges that should be generated in one pixel (island-shaped semiconductor 30) are generated in peripheral pixels (island-shaped semiconductors 30) in a distributed manner. Thus, the resolution of the solid-state imaging device is reduced and color mixture in color imaging occurs. Since the color mixture reduces the image quality of a reproduced color image, color mixture is required to be suppressed.

The pixel structure illustrated in FIG. 13 (see, for example, Patent Document 2) is a technique for increasing the light collection ratio by providing the metallic walls 39a and 39b on the photodiode region 41. In this technique, in a portion above the photodiode region 41, the light collection ratio can be improved by reducing light leakage to a pixel adjacent to the pixel of interest. However, since part of the light beam diagonally incident to the photodiode region 41 is incident to a pixel adjacent to the pixel of interest, a reduction in the resolution of the solid-state imaging device or color mixture in color imaging cannot be avoided. Such circumstances occur similarly in the solid-state imaging devices of examples of related art disclosed in Patent Documents 3 and 4. The reduction in the light collection ratio increases as the pixel density increases. Therefore, a technique for suppressing the reduction in the light collection ratio of the light beam incident to the surface of the photodiode region 41 is demanded.

SUMMARY OF THE INVENTION

The present invention has been made in view of the above-described circumstances, and it is an object of the present invention to realize a solid-state imaging device that achieves a higher pixel density, a higher resolution, less color mixture, and a higher sensitivity.

In order to achieve the above-described object, a solid-state imaging device according to an aspect of the present invention is provided in which a plurality of pixels are two-dimensionally arranged, a plurality of island-shaped semiconductors constituting the plurality of pixels being formed on a substrate.

The plurality of island-shaped semiconductors each includes a first semiconductor region formed in a lower area of the island-shaped semiconductor, a second semiconductor region formed on the first semiconductor region and having a conductivity type opposite to a conductivity type of the first semiconductor region or being an intrinsic semiconductor, a third semiconductor region formed on an upper lateral side of the second semiconductor region and having a conductivity type the same as the conductivity type of the first semiconductor region, a fourth semiconductor region formed on an outer periphery of the third semiconductor region and having a conductivity type opposite to the conductivity type of the first semiconductor region, an insulating layer formed on an outer periphery of the fourth semiconductor region and a lower lateral side of the second semiconductor region, a conductive layer formed on an outer periphery of the insulating layer and functioning as a gate electrode forming a channel in a lower area of the second semiconductor region, a reflection conductive layer formed on an outer periphery of the third semiconductor region, the fourth semiconductor region, and the insulating layer and reflecting an electromagnetic energy wave, a fifth semiconductor region formed over the second semiconductor region and the third semiconductor region and having a conductivity type the same as the conductivity type of the fourth semiconductor region, and a microlens formed over the fifth semiconductor region and whose focal point is located in a portion near an upper surface of the fifth semiconductor region.

The island-shaped semiconductor includes a portion functioning as a photoelectric conversion unit, a portion functioning as a signal charge storing unit, a portion functioning as a signal charge reading unit, and a portion functioning as a stored signal charge discharging unit.

The photoelectric conversion unit includes a photodiode region including the second semiconductor region and the third semiconductor region and an electromagnetic energy wave incident to the microlens generates signal charges in the photoelectric conversion unit.

The signal charge storing unit includes the third semiconductor region and stores the signal charges generated in the photoelectric conversion unit.

The signal charge reading unit includes a junction transistor in which each of the fifth semiconductor region and a lower area of the second semiconductor region serves as a drain or a source and the signal charge storing unit serves as a gate, and functions to read as an output signal a drain-source current which flows between the drain and the source of the junction transistor and changes in accordance with the amount of signal charges stored in the signal charge storing unit.

The stored signal charge discharging unit includes a MOS transistor in which the first semiconductor region serves as a drain, the conductive layer serves as a gate, the third semiconductor region serves as a source, and a portion of the second semiconductor region that is sandwiched between the first semiconductor region and the third semiconductor region serves as a channel, and functions to apply a certain voltage to the conductive layer to discharge the signal charges stored in the signal charge storing unit to the first semiconductor region.

According to a preferred embodiment of the present invention, in the solid-state imaging device,
an imaging operation performed by the solid-state imaging device includes
a signal charge storing operation for storing the signal charges generated in the photoelectric conversion unit in the third semiconductor region,
a signal charge reading operation for reading as an output signal the drain-source current of the junction transistor in accordance with the amount of signal charges stored in the third semiconductor region, and
a stored signal charge discharging operation for applying the certain voltage to the conductive layer to discharge the signal charges stored in the third semiconductor region to the first semiconductor region.

At the time of each of the signal charge storing operation, the signal charge reading operation, and the stored signal charge discharging operation, electric charges having a polarity opposite to a polarity of the signal charges are stored in the fourth semiconductor region.

According to a preferred embodiment of the present invention
a sixth semiconductor region having a conductivity type the same as the conductivity type of the second semiconductor region or a ninth semiconductor region having a conductivity type opposite to the conductivity type of the second semiconductor region, a seventh semiconductor region having a conductivity type the same as the conductivity type of the second semiconductor region and connected to the second semiconductor region, and an eighth semiconductor region having a conductivity type opposite to the conductivity type of the second semiconductor region are provided instead of the first semiconductor region, the sixth semiconductor region and a lower area of the second semiconductor region near the ninth semiconductor region serve as a drain and a source of the junction transistor, respectively, and the eighth semiconductor region serves as a drain of the MOS transistor.

According to a preferred embodiment of the present invention,
a reflection layer formed on a lower side of the island-shaped semiconductor is provided.

According to a preferred embodiment of the present invention,
a light-transmission insulating layer formed on a lower side of the island-shaped semiconductor and a light-absorption layer formed on a lower side of the light-transmission insulating layer are further provided.

The thickness of the light-transmission insulating layer is set in such a manner that the reflectivity of light that is incident from the microlens, that is reflected by the conductive layer and the reflection conductive layer, that is transmitted through the first to fourth semiconductor regions, and that reaches the light-transmission insulating layer is relatively increased for a case of green light and is relatively decreased for a case of red light.

According to a preferred embodiment of the present invention,
a light-transmission insulating layer formed on a lower side of the island-shaped semiconductor and a light-absorption layer formed on a lower side of the light-transmission insulating layer are further provided.

The thickness of the light-transmission insulating layer is set in such a manner that the reflectivity of light that is incident from the microlens, that is reflected by the conductive layer and the reflection conductive layer, that is transmitted through the first to fourth semiconductor regions, and that reaches the light-transmission insulating layer is relatively increased for cases of green light and red light.

According to a preferred embodiment of the present invention,
a light-transmission intermediate layer formed between the microlens and the island-shaped semiconductor is provided.

The focal point of the microlens is located inside the light-transmission intermediate layer.

According to a preferred embodiment of the present invention,
a recessed portion or a protruding portion is formed in a central surface portion of the island-shaped semiconductor.

The refractive indices of two material regions being in contact with each other across a recessed surface of the recessed portion or a protruding surface of the protruding portion as a boundary surface differ from each other.

According to a preferred embodiment of the present invention,
a light-transmission intermediate layer formed between the microlens and the island-shaped semiconductor is provided.

An angle $\theta i$ formed between a light beam that is incident from a point on an outer periphery of the microlens, that is transmitted through a centerline of the microlens and the light-transmission intermediate layer, and that reaches a point on an outer periphery of an upper area of the island-shaped semiconductor and a line that is orthogonal to an upper surface of the fifth semiconductor region is smaller than a Brewster angle $\theta b$ $(=\tan^{-1}(N_1/N_2)$; here, $N_1$: the refractive index of the light-transmission intermediate layer, $N_2$: the refractive index of the fifth semiconductor region).

According to a preferred embodiment of the present invention,
the plurality of pixels are arranged in a square grid pattern, a rectangular grid pattern, or a zigzag pattern.

A plurality of conductive wires that electrically connect the first semiconductor regions in pixels arranged in a vertical direction among the plurality of pixels and that extend in the vertical direction,
a plurality of conductive wires that electrically connect the conductive layers in pixels arranged in a horizontal direction among the plurality of pixels and that extend in the horizontal direction, and
a plurality of reflection conductive wires that electrically connect the reflection conductive layers in pixels arranged in the horizontal direction among the plurality of pixels and that extend in the horizontal direction, are further provided.

The conductive wires extending in the horizontal direction and the reflection conductive wires are not superimposed on top of one other when viewed in a direction of application of electromagnetic energy waves to the plurality of pixels and are arranged alternately in the vertical direction.

According to a preferred embodiment of the present invention,
the reflection conductive layer in each of the plurality of pixels is electrically isolated from the fifth semiconductor region in the corresponding pixel, and all the reflection conductive layers in the plurality of pixels are connected to each other so as to cover a pixel region where the plurality of pixels are arranged.

According to the present invention, a solid-state imaging device that achieves a higher pixel density, a higher resolution, less color mixture, and a higher sensitivity can be provided.

BRIEF DESCRIPTION OF THE DRAWINGS

FIG. 2D is a potential distribution diagram illustrating a portion taken along line B-B' in FIG. 2C.

FIG. 2E is a potential distribution diagram illustrating a portion taken along line B-B' in FIG. 2C.

FIG. 10A is a schematic three-dimensional structure diagram illustrating a state where a light beam is incident to a gap G2 for island-shaped semiconductors in the schematic three-dimensional structure illustrated in FIG. 1C.

FIG. 10C is a schematic three-dimensional structure diagram illustrating the three-dimensional structure of adjacent two pixels (island-shaped semiconductors) in the solid-state imaging device according to the eighth embodiment.

DETAILED DESCRIPTION OF THE PREFERRED EMBODIMENTS

Hereinafter, solid-state imaging devices according to embodiments of the present invention will be explained with reference to the drawings.

Embodiment 1

Figure 1A:
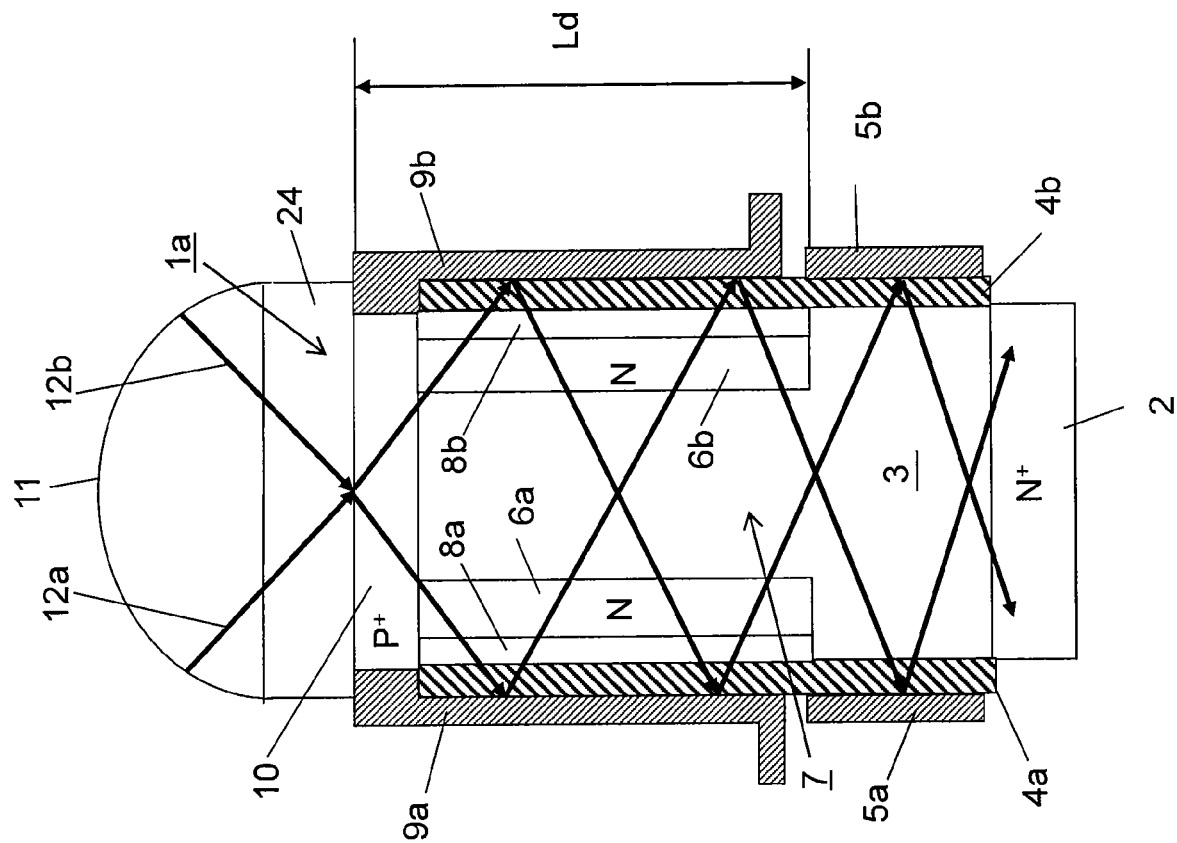
FIG. 1A is a cross-section diagram illustrating the pixel structure of a solid-state imaging device according to a first embodiment of the present invention.

FIG. 1A illustrates the cross-sectional structure of an island-shaped semiconductor 1a constituting a pixel in a solid-state imaging device according to a first embodiment of the present invention.

As illustrated in FIG. 1A, a first semiconductor $N^+$-region 2, which is a signal line extending in a first scanning direction in a pixel region on a substrate, is formed so as to extend over the entire lower portion of the island-shaped semiconductor 1a constituting a pixel. On the first semiconductor $N^+$-region 2, a second semiconductor P-region 3 whose conductivity type is opposite to that of the first semiconductor $N^+$-region 2 is formed. On upper lateral sides of the second semiconductor P-region 3, third semiconductor N-regions 6a and 6b whose conductivity type is the same as that of the first semiconductor $N^+$-region 2 are formed.

Insulating layers 4a and 4b are formed so as to surround the outer periphery of the third semiconductor N-regions 6a and 6b and lower lateral sides of the second semiconductor P-region 3. Gate conductive layers 5a and 5b are formed in a lower area of the second semiconductor P-region 3 so as to surround the outer periphery of the insulating layers 4a and 4b. The gate conductive layers 5a and 5b are made of for example, a metallic material and also function as light-reflection layers that reflect light (electromagnetic energy waves).

A MOS transistor, in which the third semiconductor N-regions 6a and 6b serve as a source, the gate conductive layers 5a and 5b serve as a gate, the first semiconductor $N^+$-region 2 serves as a drain, and a portion of the second semiconductor P-region 3 sandwiched between the third semiconductor N-regions 6a and 6b and the first semiconductor $N^+$-region 2 serves as a channel, is formed in the island-shaped semiconductor 1a constituting a pixel. Above the gate conductive layers 5a and 5b, a photodiode region 7 including the second semiconductor P-region 3 and the third semiconductor N-regions 6a and 6b is formed.

In a surface area of the photodiode region 7, fourth semiconductor P$^+$-regions 8a and 8b are formed. The fourth semiconductor P$^+$-regions 8a and 8b are formed between the third semiconductor N-regions 6a and 6b and the insulating layers 4a and 4b so as to be in contact with the insulating layers 4a and 4b. Light-reflection conductive layers 9a and 9b that reflect electromagnetic energy waves, such as light, are formed on the outer periphery of the fourth semiconductor P$^+$-regions 8a and 8b with the insulating layers 4a and 4b therebetween. The light-reflection conductive layers 9a and 9b are formed on the outer periphery of a portion of the insulating layers 4a and 4b where the gate conductive layers 5a and 5b are not formed, that is, on the outer periphery of the third semiconductor N-regions 6a and 6b. The light-reflection conductive layers 9a and 9b are made of, for example, a metallic material and function as conductive layers through which current flows and as light-reflection layers that reflect light.

Above the third semiconductor N-regions 6a and 6b, a fifth semiconductor P$^+$-region 10 that is electrically connected to the fourth semiconductor P$^+$-regions 8a and 8b and whose conductivity type is the same as that of the second semiconductor P-region 3 is formed. The fifth semiconductor P$^+$-region 10 is connected to the light-reflection conductive layers 9a and 9b. The light-reflection conductive layers 9a and 9b serve as pixel-selecting lines extending in the direction orthogonal to the first scanning direction (signal line). Thus, the light-reflection conductive layers 9a and 9b function as light-reflection layers and pixel-selecting lines. It is desirable that at least the third semiconductor N-regions 6a and 6b, the fourth semiconductor P$^+$-regions 8a and 8b, and the fifth semiconductor P$^+$-region 10 be formed inside the island-shaped semiconductor 1a.

In the island-shaped semiconductor 1a constituting a pixel, the photodiode region 7 including the second semiconductor P-region 3 and the third semiconductor N-regions 6a and 6b serves as a photoelectric conversion unit, and the third semiconductor N-regions 6a and 6b of the photodiode region 7 serves as a signal charge storing unit for storing signal charges generated in the photoelectric conversion unit. A junction transistor, in which each of the fifth semiconductor P$^+$-region 10 and a portion of the second semiconductor P-region 3 near the first semiconductor N$^+$-region 2 serves as a source or a drain, and the third semiconductor N-regions 6a and 6b of the photodiode region 7 serve as a gate, serves as a signal charge reading unit for reading from the first semiconductor N$^+$-region 2 the source-drain current corresponding to the amount of signal charges stored in the photodiode region 7 as a signal current. The MOS transistor, in which the third semiconductor N-regions 6a and 6b serve as a source, the gate conductive layers 5a and 5b serve as a gate, the first semiconductor N$^+$-region 2 serves as a drain, and a portion of the second semiconductor P-region 3 sandwiched between the third semiconductor N-regions 6a and 6b and the first semiconductor N$^+$-region 2 serves as a channel, serves as a stored signal charge discharging unit for discharging the signal charges stored in the third semiconductor N-regions 6a and 6b to the first semiconductor N$^+$-region 2. In this embodiment, the photoelectric conversion unit, the signal charge storing unit, the signal charge reading unit, and the stored signal charge discharging unit are formed inside the island-shaped semiconductor 1a and the outer periphery of a portion of the island-shaped semiconductor 1a where the photoelectric conversion unit is formed is surrounded by the light-reflection conductive layers 9a and 9b.

A light-transmission intermediate region 24 made of a light-transmission material is formed on the fifth semiconductor P$^+$-region 10, and a microlens 11 whose focal point is located near the upper surface of the fifth semiconductor P$^+$-region 10 is formed on the light-transmission intermediate region 24. The light-transmission intermediate region 24 and the microlens 11 are each made of, for example, a transparent resin material.

In the island-shaped semiconductor 1a, light beams (electromagnetic energy waves) 12a and 12b incident from the upper surface of the microlens 11 are collected at the focal point of the microlens 11 that is located near the upper surface of the fifth semiconductor P$^+$-region 10. Among the collected light beams 12a and 12b, part of the light beams 12a and 12b that is incident to the island-shaped semiconductor 1a and is not perpendicularly incident to the central portion of the microlens 11 is reflected by the light-reflection conductive layers 9a and 9b, which are pixel-selecting lines, and the gate conductive layers 5a and 5b, is propagated downward inside the island-shaped semiconductor 1a, and is absorbed inside the island-shaped semiconductor 1a to generate signal charges.

Thus, the light propagation length in the photodiode region 7, which is a light-sensitive region, is greater than the height Ld of the photodiode region. As described above, being capable of setting the light propagation length in the photodiode region 7, which is a light-sensitive region, to be longer means, compared to the solid-state imaging device of the example of related art having the pixel structure illustrated in FIG. 12A, being capable of achieving the same sensitivity while reducing the height Ld of the photodiode region.

Accordingly, since the aspect ratio of the island-shaped semiconductor 1a (the ratio between the one upper side length of the island-shaped semiconductor 1a and the height Ld of the photodiode region) can be reduced, the pixel structure including island-shaped semiconductors each constituting a pixel can be fabricated easily. In addition, in this embodiment, since the light beams 12a and 12b diagonally incident to the island-shaped semiconductor 1a constituting a pixel are reflected by the light-reflection conductive layers 9a and 9b and the gate conductive layers 5a and 5b, the light beams 12a and 12b are prevented from leaking to island-shaped semiconductors constituting pixels adjacent to the island-shaped semiconductor 1a constituting the pixel of interest. Consequently, a reduction in the resolution of the solid-state imaging device and color mixture in color imaging can be prevented.

Figure 1B:
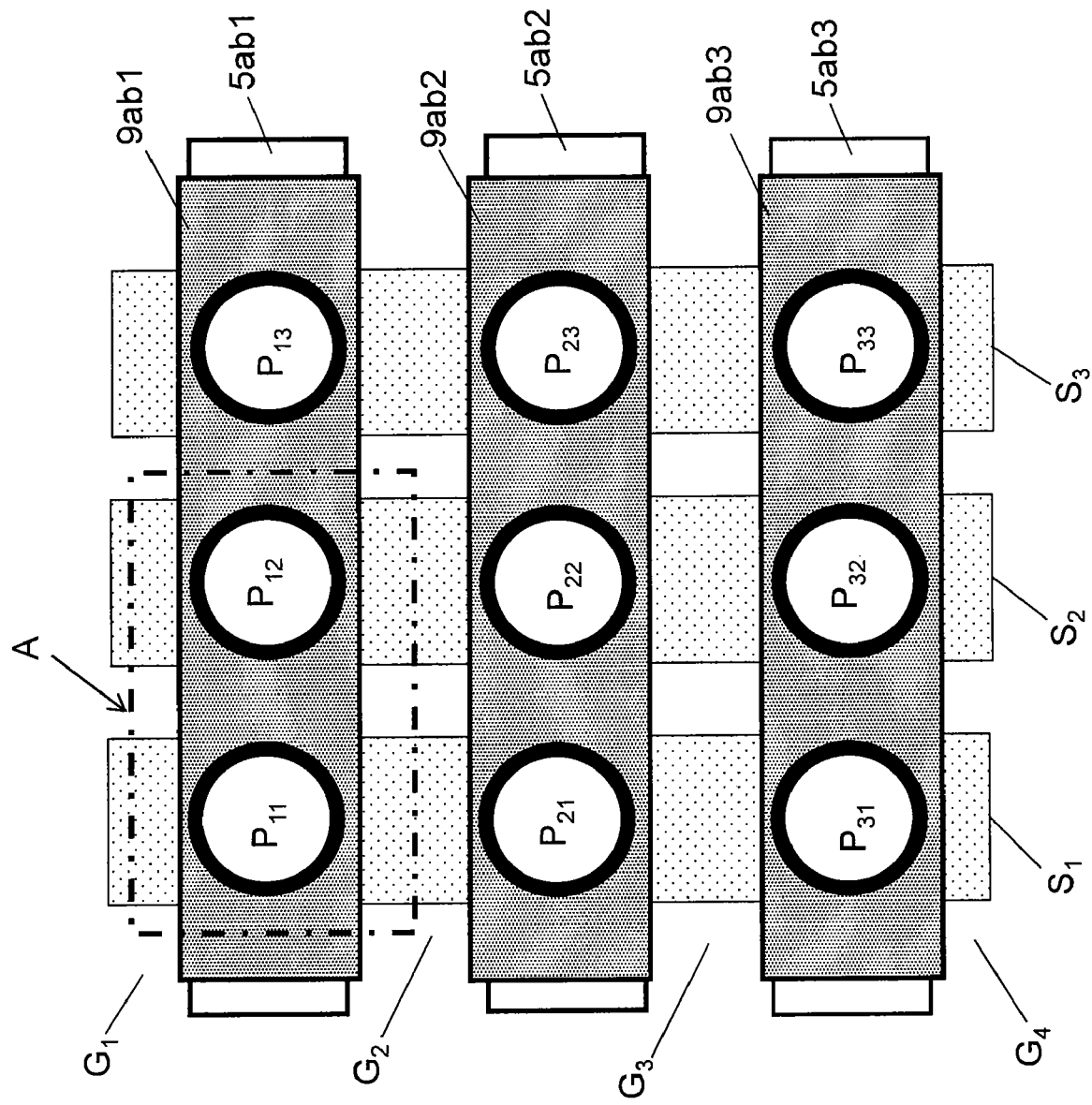
FIG. 1B is a schematic plan view of the solid-state imaging device according to the first embodiment when viewed from a light incidence surface side.

FIG. 1B is a schematic plan view illustrating the arrangement state of island-shaped semiconductors $P_{11}$ to $P_{33}$ constituting 3×3 (=9) pixels arranged in a pixel region in the solid-state imaging device according to this embodiment when viewed from the light incidence surface side.

As illustrated in FIG. 1B, the island-shaped semiconductors $P_{11}$ to $P_{33}$ each constituting a pixel including a microlens on the upper surface thereof are formed on signal line semiconductor N$^+$-regions S1, S2, and S3 extending in the vertical direction on the drawing. Pixel-selecting lines 9ab1, 9ab2, and 9ab3 and MOS gate wires 5ab1, 5ab2, and 5ab3 are formed so as to surround the island-shaped semiconductors $P_{11}$ to $P_{33}$ arranged in the row direction of the island-shaped semiconductors $P_{11}$ to $P_{33}$ arranged in a matrix. The pixel-selecting lines 9ab1, 9ab2, and 9ab3 and the MOS gate wires 5ab1, 5ab2, and 5ab3 are arranged so as to be superimposed on top of one other. The signal line semiconductor N$^+$-regions $S_1$, $S_2$, and $S_3$, the MOS gate wires $5ab1$, $5ab2$, and $5ab3$, and the pixel-selecting lines $9ab1$, $9ab2$, and $9ab3$ are connected to a drive/output circuit (not illustrated) provided near the pixel region.

Figure 1C:
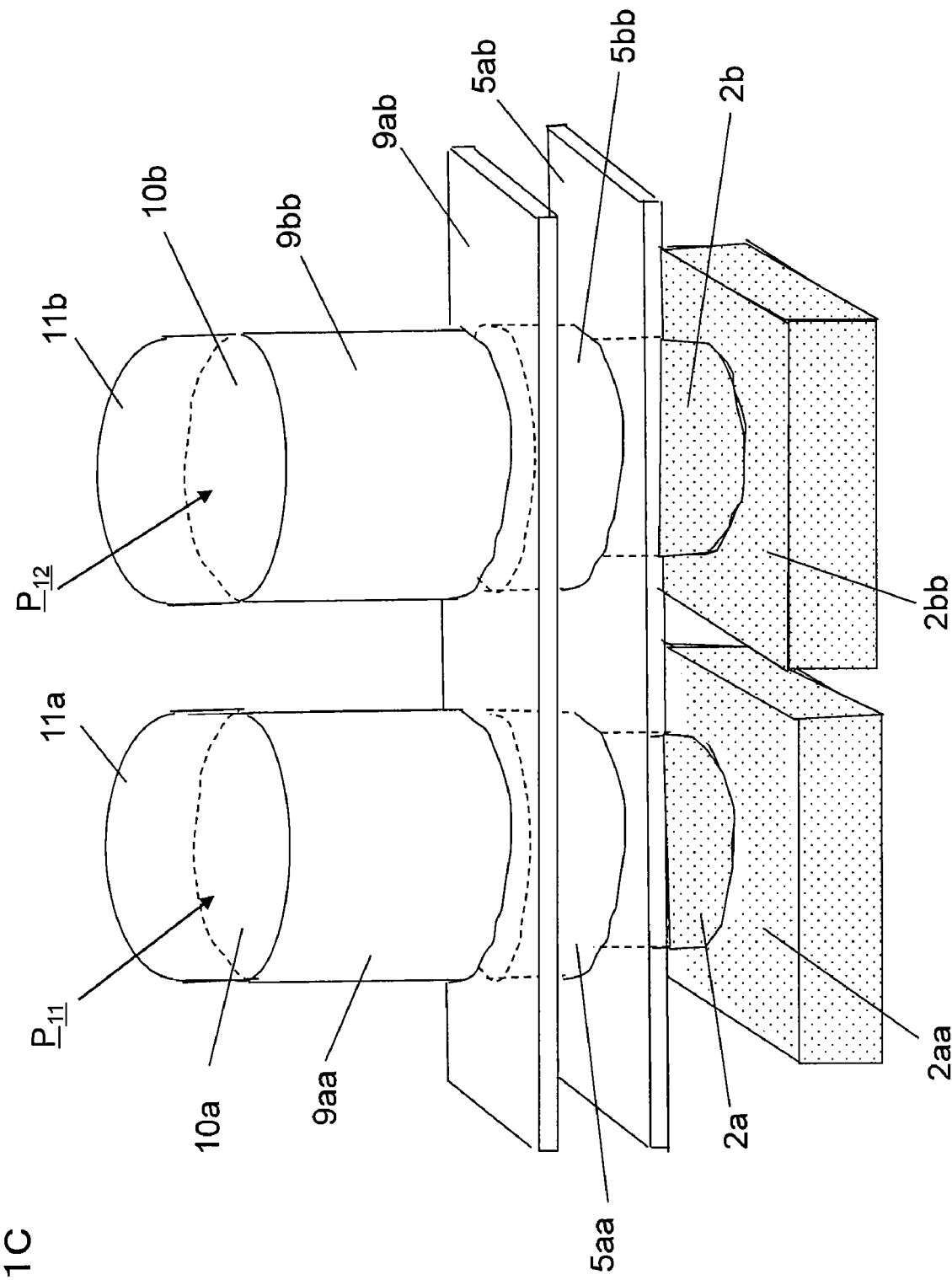
FIG. 1C is a schematic three-dimensional structure diagram illustrating the three-dimensional structure of adjacent two pixels (island-shaped semiconductors) in the solid-state imaging device according to the first embodiment.

FIG. 1C illustrates a schematic three-dimensional structure diagram of a rectangular area surrounded by the one-dot chain line A in FIG. 1B. As illustrated in FIG. 1C, in the island-shaped semiconductors $P_{11}$ and $P_{12}$, first semiconductor $N^+$-regions $2a$ and $2b$ each corresponding to the first semiconductor $N^+$-region 2 of the island-shaped semiconductor $1a$ illustrated in FIG. 1A are arranged. The first semiconductors $N^+$-region $2a$ and $2b$ are electrically connected to band-shaped signal line $N^+$-regions $2aa$ and $2bb$, respectively, extending in the first scanning direction on the substrate.

Ring-shaped gate conductive layers $5aa$ and $5bb$ are also formed so as to surround the outer periphery of the island-shaped semiconductors $P_{11}$ and $P_{12}$, respectively. The gate conductive layers $5aa$ and $5bb$ are electrically connected to a MOS gate wire $5ab$ ($5ab1$, $5ab2$, and $5ab3$) extending in the direction orthogonal to the band-shaped signal line $N^+$-regions $2aa$ and $2bb$. Ring-shaped light-reflection conductive layers $9aa$ and $9bb$ are formed so as to surround the outer periphery of the island-shaped semiconductors $P_{11}$ and $P_{12}$, respectively. The light-reflection conductive layers $9aa$ and $9bb$ are electrically connected to a pixel-selecting line $9ab$ extending in the direction orthogonal to the band-shaped signal line $N^+$-regions $2aa$ and $2bb$. The light-reflection conductive layers $9aa$ and $9bb$ are also electrically connected to fifth semiconductor $P^+$-regions $10a$ and $10b$ arranged above the light-reflection conductive layers $9aa$ and $9bb$. Microlenses $11a$ and $11b$ are arranged above the fifth semiconductor $P^+$-regions $10a$ and $10b$.

In the island-shaped semiconductors $P_{11}$ and $P_{12}$ formed on the band-shaped signal line $N^+$-regions $2aa$ and $2bb$, the gate conductive layers $5aa$ and $5bb$ that reflect light and the light-reflection conductive layers $9aa$ and $9bb$ are formed so as to surround the island-shaped semiconductors $P_{11}$ and $P_{12}$. Since a sufficient amount of donor impurities are doped to the first semiconductor $N^+$-regions $2a$ and $2b$ and the band-shaped signal line $N^+$-regions $2aa$ and $2bb$, signal charges (here, free electrons) are not generated by incident light beams (electromagnetic energy waves) in the first semiconductor $N^+$-regions $2a$ and $2b$ and the band-shaped signal line $N^+$-regions $2aa$ and $2bb$. Therefore, light beams incident from the microlenses $11a$ and $11b$ to the island-shaped semiconductors $P_{11}$ and $P_{12}$ rarely leak to island-shaped semiconductors constituting pixels adjacent to the island-shaped semiconductors $P_{11}$ and $P_{12}$ and are propagated inside the island-shaped semiconductors $P_{11}$ and $P_{12}$ while being reflected by the gate conductive layers $5aa$ and $5bb$ and the light-reflection conductive layers $9aa$ and $9bb$. Then, the propagated light beams are absorbed in the island-shaped semiconductors $P_{11}$ and $P_{12}$ and signal charges are generated. Accordingly, the height of the island-shaped semiconductors $P_{11}$ and $P_{12}$ can be reduced, the processability of the pixel structure can be improved, and the pixel density can be increased. Furthermore, a solid-state imaging device that prevents a reduction in the resolution and color mixture in color imaging can be provided.

In the first embodiment, the second semiconductor P-region 3 (see FIG. 1A) is formed of a P-type semiconductor. However, the second semiconductor P-region 3 may be an intrinsic semiconductor, instead of a P-type semiconductor. Intrinsic semiconductors are semiconductors in which impurities are not doped in the matrix thereof and the Fermi level thereof is located near the center of the energy gap between the lower end of a conductor and the upper end of a valence band. Regarding intrinsic semiconductors, a semiconductor in which a very small quantity of acceptor impurity is doped is referred to as a $P^-$-type, a pure semiconductor in which no impurity is doped is referred to as an intrinsic type, and a semiconductor in which a very small quantity of donor impurity is doped is referred to as an $N^-$-type. Intrinsic semiconductors have a high resistance. When a voltage is applied between the fifth semiconductor $P^*$regions $10a$ and $10b$ and the band-shaped signal line $N^+$-regions $2aa$ and $2bb$, a potential gradient occurs inside the intrinsic semiconductor, and inside the bulk having such a potential gradient, positive holes (holes) injected from the fifth semiconductor $P^+$-regions $10a$ and $10b$ are made to flow toward the signal line $N^+$-regions $2aa$ and $2bb$. Therefore, the second semiconductor P-region 3 including the intrinsic semiconductor functions as the channel of a junction transistor.

Embodiment 2

Figure 2A:
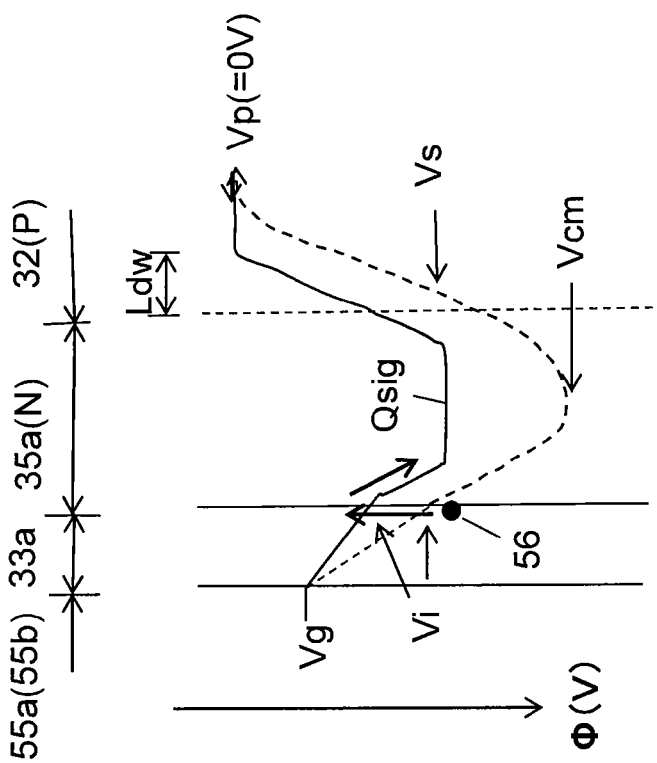
FIG. 2A is a cross-section diagram illustrating the pixel structure of a solid-state imaging device according to an example of related art.
Figure 2B:
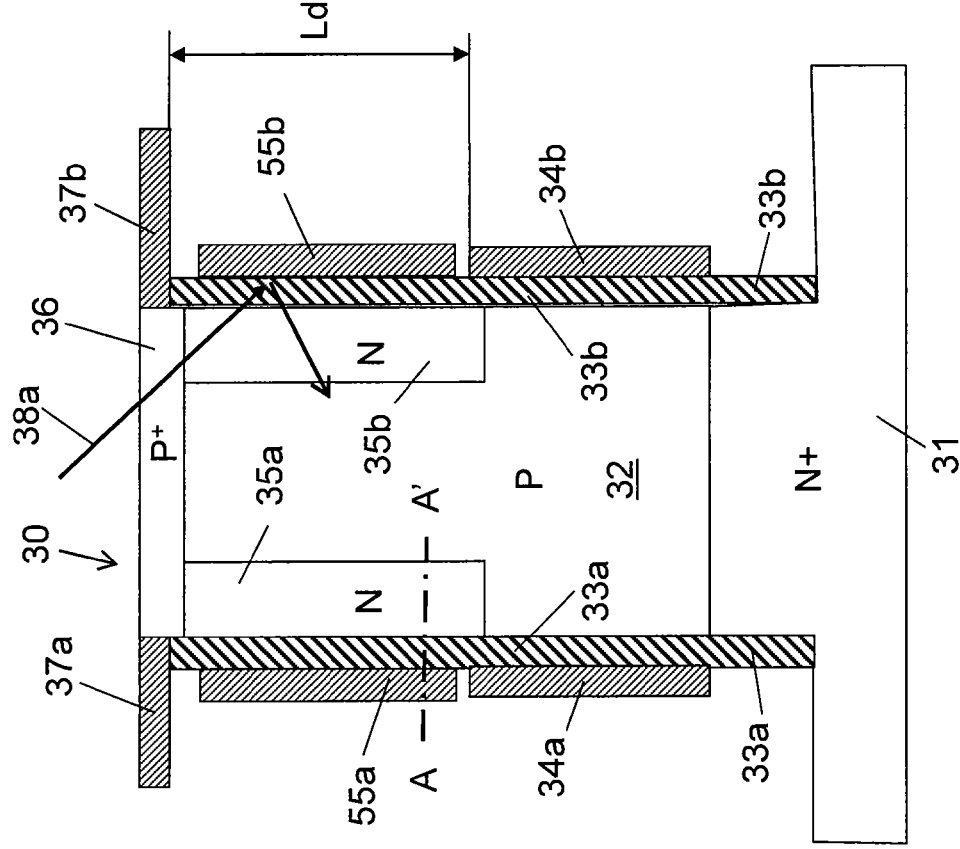
FIG. 2B is a potential distribution diagram illustrating a portion taken along line A-A' in FIG. 2A.

FIG. 2A and FIG. 2B illustrate a cross-section diagram and a potential distribution diagram of a solid-state imaging device according to an example of related art. FIG. 2C to FIG. 2F illustrate the pixel structure, potential distribution diagrams, and a schematic plan view of a solid-state imaging device according to a second embodiment of the present invention.

The solid-state imaging device according to this embodiment not only solves problems relating to a higher pixel density, a higher sensitivity, a reduction in the resolution, and color mixture in color imaging, which are problems of a solid-state imaging device according to related art (see FIG. 12A), but also prevents generation of dark current and dark current noise.

Figure 12A:
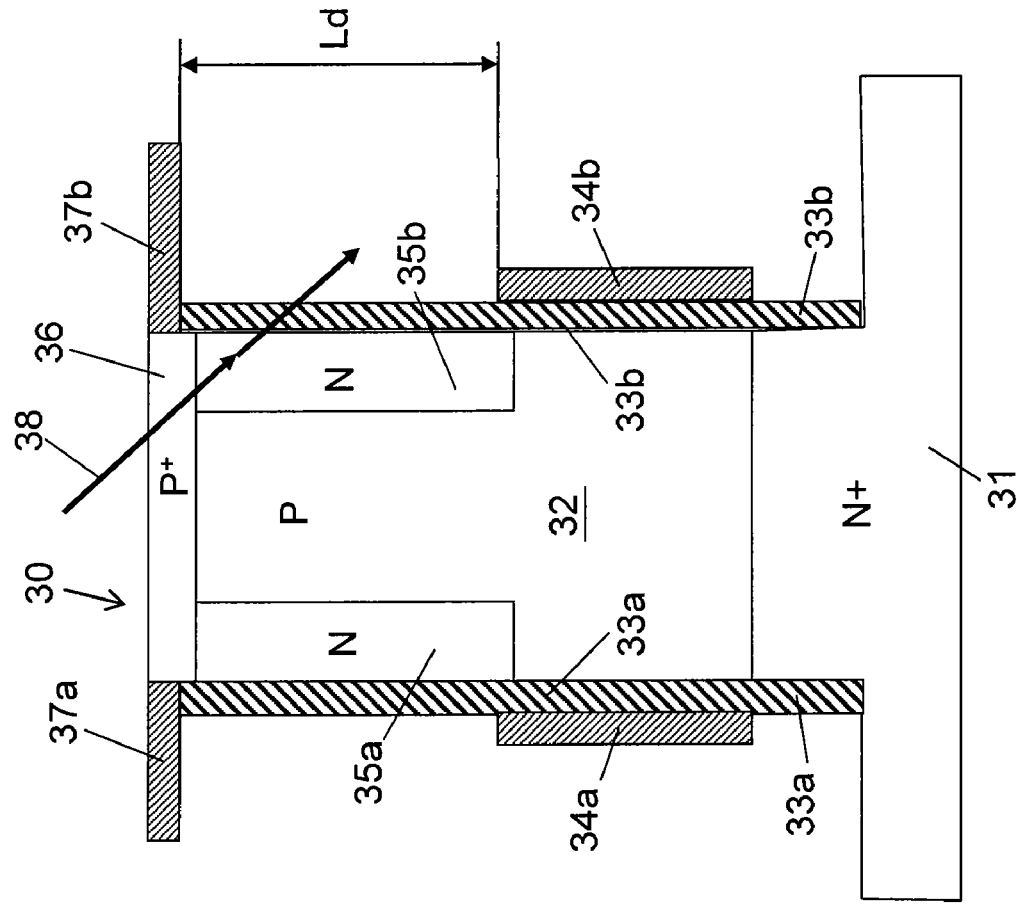
FIG. 12A is a cross-section diagram illustrating the pixel structure of a solid-state imaging device according to an example of related art.
Figure 12B:
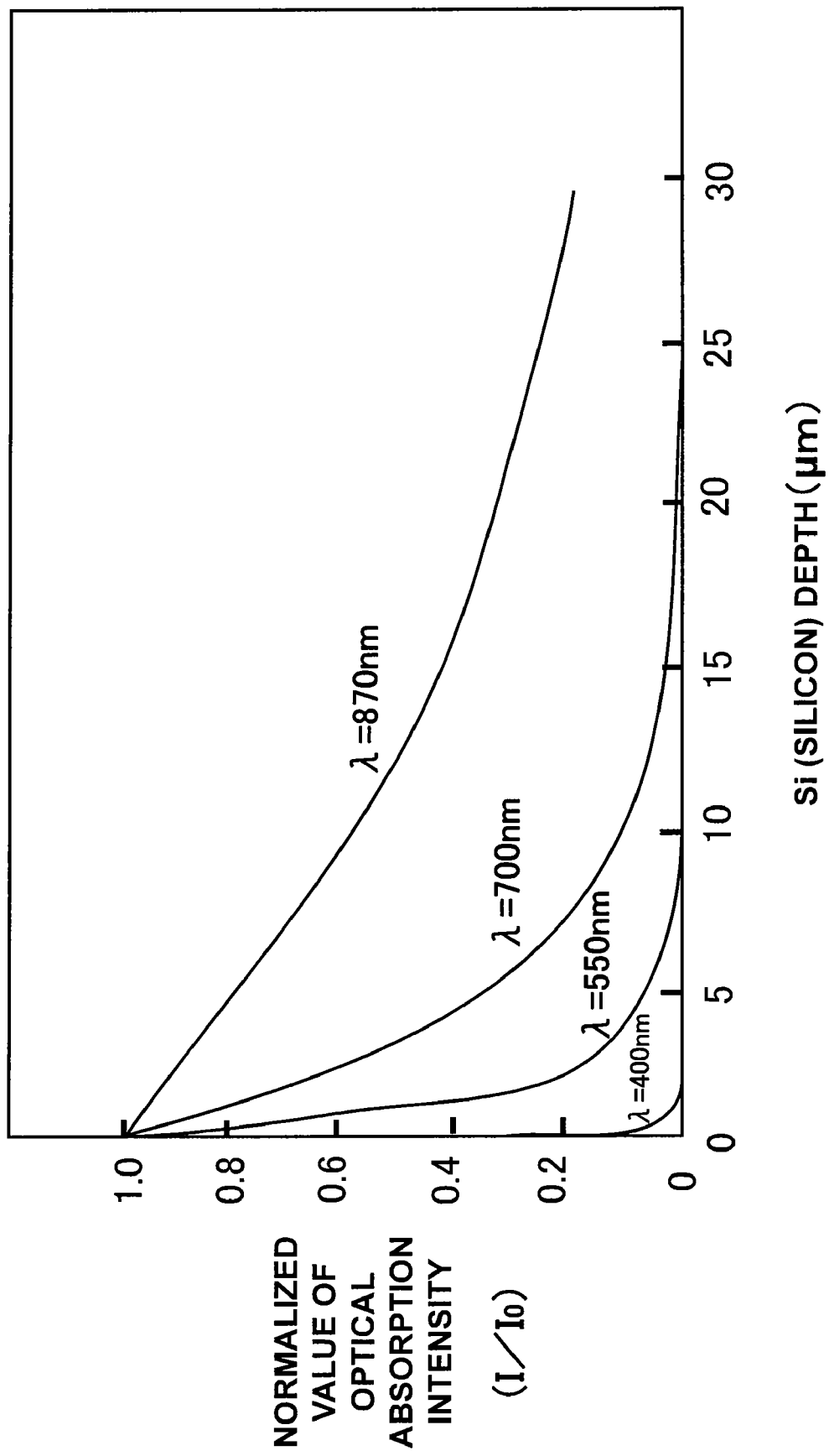
FIG. 12B is a graph illustrating the relationship between the depth of Si (silicon) and the optical absorption intensity.

The cross-sectional structure of the island-shaped semiconductor 30 illustrated in FIG. 2A is the same as the pixel structure illustrated in FIG. 1A with the exception in that, in order to prevent a reduction in the resolution and color mixture in color image, which occur in the solid-state imaging device according to the example of related art illustrated in FIG. 12A, light-shielding metallic layers $55a$ and $55b$ for shielding light are provided so as to surround the outer periphery of the semiconductor N-regions $35a$ and $35b$ in the photodiode region with the insulating layers $33a$ and $33b$ therebetween and that the fourth semiconductor $P^+$-regions $8a$ and $8b$ are not formed in the surface area of the photodiode region. Thus, the explanation of portions referred to with the same reference numerals and signs will be omitted, except for the explanation provided below. In this pixel structure, since an incident light beam $38a$ is reflected by the light-shielding metallic layers $55a$ and $55b$, light leakage to a photodiode region of an adjacent pixel is prevented.

However, although providing the light-shielding metallic layers $55a$ and $55b$ so as to surround the semiconductor N-regions $35a$ and $35b$ in the photodiode region prevents a reduction in the resolution and color mixture in color imaging, generation of dark current and dark current noise cannot be prevented.

FIG. 2B illustrates a potential distribution diagram illustrating a portion taken along line A-A' of FIG. 2A at the time of a signal charge storing operation of the solid-state imaging device according to this embodiment. As illustrated in FIG. 2B, a plus voltage of Vg (V) is applied to the light-shielding metallic layer $55a$ ($55b$) and a voltage of Vp (V) of the semiconductor P-region 32 is set to a ground voltage of Vp (=0 V).

Referring to FIG. 2B, potential distribution when signal charges Qsig (here, free electrons) are not stored in the semiconductor N-region 35*a* is represented by the dotted line and potential distribution when the signal charges Qsig are stored is represented by the solid line. The bottom of the potential distribution (the position exhibiting the highest voltage) in the case where no signal charges are stored is located inside the semiconductor N-region 35*a* and the potential at the bottom of the potential distribution is Vcm.

In the case where the signal charges Qsig are stored in the semiconductor N-region 35*a*, a potential of Vg in the light-shielding metallic layer 55*a* (55*b*) becomes deeper, via the insulating layer 33*a*, to a phase boundary potential of Vi in the semiconductor N-region 35*a*. Then, in the area where the signal charges Qsig are stored, a potential of Vs is maintained in the signal charge storing unit, and the potential Vs in the semiconductor N-region 35*a* becomes shallower to Vp in the semiconductor P-region 32.

As described above, the depletion layer length Ldw extending over the semiconductor P-region 32 changes depending on whether or not the signal charges Qsig are stored. In addition, when the phase boundary potential between the insulating layer 33*a* and the semiconductor N-region 35*a* is represented by Vi (V), in the semiconductor N-region 35*a*, the potential is changed from the phase boundary so as to become deeper to Vcm or Vs inside the semiconductor N-region 35*a*, depending on whether or not the signal charges Qsig are stored. When electrons 56 existing at the energy level at the phase boundary between the insulating layer 33*a* and the semiconductor N-region 35*a* is thermally excited by a conduction-band in this state, the electrons 56 are mixed into the signal charges Qsig having a deeper potential in the semiconductor N-region 35*a*. The mixed electrons 56 are referred to as dark current, and dark current variations between pixels cause dark current non-uniformity. In addition, the dark current itself becomes noise (unwanted signal) and reduces the S/N (signal-to-noise ratio). Referring to FIG. 2B, even when the voltage Vg in the light-shielding metallic layers 55*a* and 55*b* is changed to the ground voltage (0 V) or the like, Vs is inevitably deeper than Vi. Thus, the electrons 56 of dark current generated at the phase boundary between the insulating layer 33*a* and the semiconductor N-region 35*a* always move inside the semiconductor N-region 35*a* and are mixed into the signal charges Qsig. Therefore, in the case where the light-shielding metallic layers 55*a* and 55*b* are provided in the pixel structure of the example of related art illustrated in FIG. 12A, generation of dark current and dark current noise cannot be suppressed.

Figure 2C:
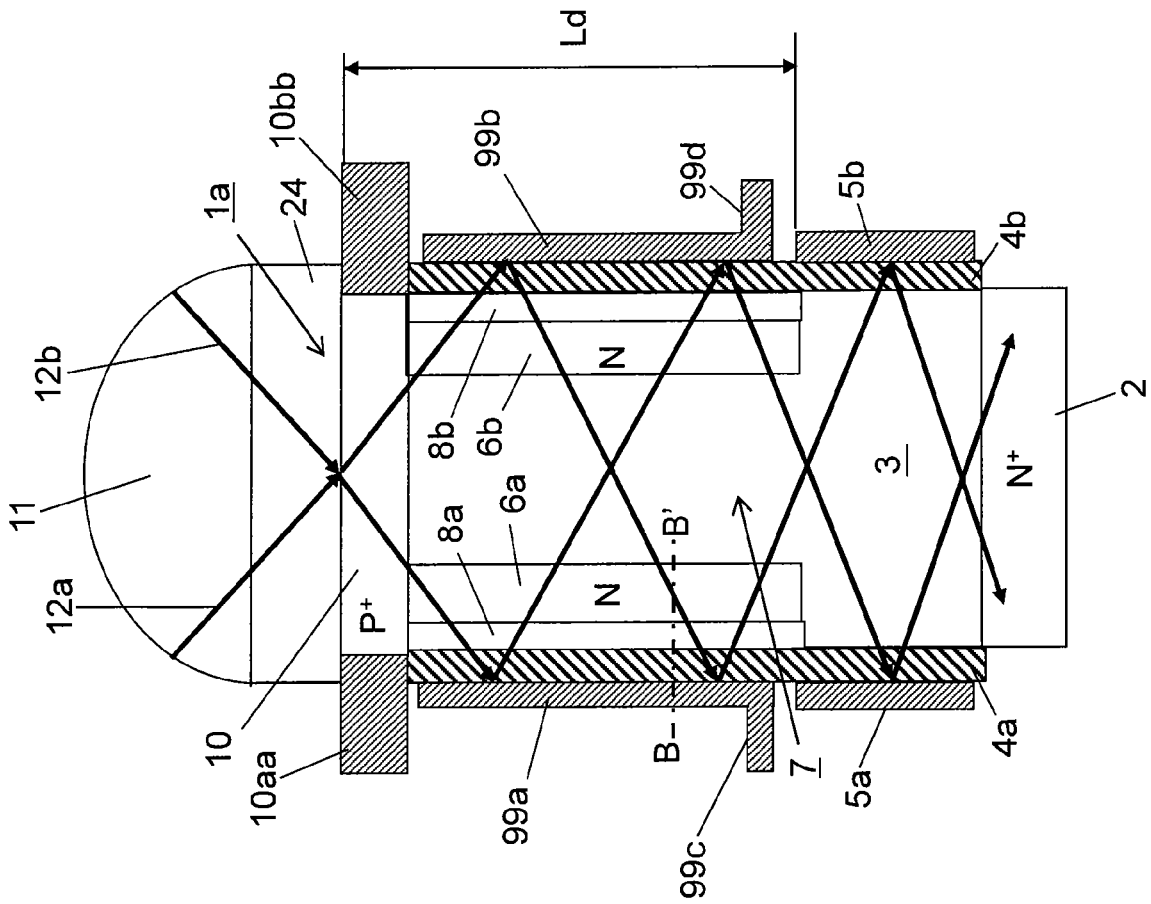
FIG. 2C is a cross-section diagram illustrating the pixel structure of a solid-state imaging device according to a second embodiment of the present invention.

FIG. 2C illustrates the pixel structure of the solid-state imaging device according to this embodiment. As illustrated in FIG. 2C, the first semiconductor N+-region 2 serving as a signal line is formed in a lower area of the island-shaped semiconductor 1*a* constituting a pixel. The second semiconductor P-region 3 whose conductivity type is opposite to that of the first semiconductor N+-region 2 (the second semiconductor P-region 3 may be formed of an intrinsic semiconductor, instead of a P-type semiconductor) is formed on the first semiconductor N+-region 2. On upper lateral sides of the second semiconductor P-region 3, the third semiconductor N-regions 6*a* and 6*b* whose conductivity type is the same as that of the first semiconductor N+-region 2 are formed.

The insulating layers 4*a* and 4*b* are formed so as to surround the outer periphery of the third semiconductor N-regions 6*a* and 6*b* and lower lateral sides of the second semiconductor P-region 3. The gate conductive layers 5*a* and 5*b* are formed in a lower area of the second semiconductor P-region 3 so as to surround the outer periphery of the insulating layers 4*a* and 4*b*. The gate conductive layers 5*a* and 5*b* are made of, for example, a metallic material and also function as light-reflection layers that reflect light beams (electromagnetic energy waves).

In the island-shaped semiconductor 1*a* constituting a pixel, the MOS transistor is formed in which the third semiconductor N-regions 6*a* and 6*b* serve as a source, the gate conductive layers 5*a* and 5*b* serve as a gate, the first semiconductor N+-region 2 serves as a drain, and a portion of the second semiconductor P-region 3 between the first semiconductor N+-region 2 and the third semiconductor N-regions 6*a* and 6*b* serves as a channel. The photodiode region 7 including the second semiconductor P-region 3 and the third semiconductor N-regions 6*a* and 6*b* is formed above the gate conductive layers 5*a* and 5*b*.

In a surface area of the photodiode region 7, the fourth semiconductor P+-regions 8*a* and 8*b* are formed. The fourth semiconductor P+-regions 8*a* and 8*b* are formed between the third semiconductor N-regions 6*a* and 6*b* and the insulating layers 4*a* and 4*b* so as to be in contact with the insulating layers 4*a* and 4*b*. Light-reflection conductive layers 99*a* and 99*b* that reflect electromagnetic energy waves, such as light, are formed on the outer periphery of the fourth semiconductor P+-regions 8*a* and 8*b* with the insulating layers 4*a* and 4*b* therebetween. The light-reflection conductive layers 9*a* and 9*b* are formed on the outer periphery of a portion of the insulating layers 4*a* and 4*b* where the gate conductive layers 5*a* and 5*b* are not formed, that is, on the outer periphery of the third semiconductor N-regions 6*a* and 6*b*. The light-reflection conductive layers 99*a* and 99*b* are made of, for example, a metallic material and function as conductive layers through which current flows and as light-reflection layers that reflect light.

Above the third semiconductor N-regions 6*a* and 6*b*, the fifth semiconductor P+-region 10 that is electrically connected to the fourth semiconductor P+-regions 8*a* and 8*b* and whose conductivity type is the same as that of the second semiconductor P-region 3 is formed. The fifth semiconductor P+-region 10 is electrically connected to metallic layers 10*aa* and 10*bb*. The metallic layers 10*aa* and 10*bb* serve as pixel-selecting lines extending in the direction orthogonal to the first scanning direction (signal line). Thus, the metallic layers 10*aa* and 10*bb* function as light-reflection layers and pixel-selecting lines. Furthermore, the light-reflection conductive layers 99*a* and 99*b* are electrically connected to light-reflection conductive layers 99*c* and 99*d* located between island-shaped semiconductors 1*a* each constituting a pixel.

In this embodiment, since a photoelectric conversion unit (photodiode region 7), a signal charge storing unit, a signal charge reading unit, and a stored signal charge discharging unit are similar to those in the island-shaped semiconductor 1*a* in the first embodiment illustrated in FIG. 1A, the explanation of those similar units will be omitted.

The light-transmission intermediate region 24 made of a light-transmission material is formed on the fifth semiconductor P+-region 10. The microlens 11 whose focal point is located near the upper surface of the fifth semiconductor P+-region 10 is formed on the light-transmission intermediate region 24. The light-transmission intermediate region 24 and the microlens 11 are each made of, for example, a transparent resin material.

In the island-shaped semiconductor 1*a*, the light beams 12*a* and 12*b* incident from the upper surface of the microlens 11 are collected at the focal point of the microlens 11 that is located near the upper surface of the fifth semiconductor P+-region 10. Among the collected light beams 12*a* and 12*b*, part of the light beams 12*a* and 12*b* that is incident to the island-shaped semiconductor 1a and that is not perpendicularly incident to the central portion of the microlens 11 is reflected by the light-reflection conductive layers 99a and 99b, which are pixel-selecting lines, and the gate conductive layers 5a and 5b, is propagated inside the island-shaped semiconductor 1a, and is absorbed inside the island-shaped semiconductor 1a to generate signal charges. Thus, similarly to the solid-state imaging device according to the first embodiment, the height of the island-shaped semiconductor 1a (the height Ld of the photodiode region 7) can be reduced. As a result, the processability of the pixel structure including island-shaped semiconductors each constituting a pixel can be improved, and the pixel density can be increased. Furthermore, a solid-state imaging device that prevents a reduction in the resolution and color mixture in color imaging can be provided.

FIG. 2D is a potential distribution diagram illustrating a portion taken along line B-B' of FIG. 2C at the time of a signal charge storing operation of the solid-state imaging device according to this embodiment. As illustrated in FIG. 2D, a ground voltage of Vg (=0 V) is applied to the light-reflection conductive layer 99a. Similarly, the ground voltage Vg (=0 V) is also applied to the first semiconductor $N^+$-region 2 and the fifth semiconductor $P^+$-region 10.

Referring to FIG. 2C, since the fourth semiconductor $P^+$-region 8a is electrically connected to the fifth semiconductor $P^+$-region 10, the potential of the fourth semiconductor $P^+$-region 8a is set to the ground voltage Vg (=0 V).

In a state where the signal charges Qsig are stored in the third semiconductor N-region 6a, from the fourth semiconductor $P^+$-region 8a toward the third semiconductor N-region 6a, a potential of Vg becomes deeper to a potential of Vs where the signal charges Qsig are stored. In an area where the signal charges Qsig are stored, a constant potential of Vs is maintained. Then, toward the second semiconductor P-region 3, the potential is reduced to a potential of Vp in the second semiconductor P-region 3. In this state, a large number of positive holes (holes) 56d supplied from the fifth semiconductor $P^+$-region 10 exist in the fourth semiconductor $P^+$-region 8a. Thus, when electrons 56c located at the energy level at the phase boundary between the insulating layer 4a and the fourth semiconductor $P^+$-region 8a are thermally excited by a conduction-band, the electrons 56c are recombined with the positive holes 56d existing in the fourth semiconductor $P^+$-region 8a and disappear. Consequently, the excited electrons 56c are not mixed into the signal charges Qsig, and no dark current or dark current noise is generated.

FIG. 2E is a potential distribution diagram illustrating a portion taken along line B-B' of FIG. 2C at the time of a signal charge reading operation of the solid-state imaging device according to this embodiment. Referring to FIGS. 2C and 2E, at the time of the signal charge reading operation, a plus voltage of VH (V) is applied to the fifth semiconductor $P^+$-region 10, and a ground voltage of Vg (=0 V) is applied to each of the light-reflection conductive layer 99a, the first semiconductor $N^+$-region 2 serving as a signal line, and the gate conductive layer 5a. As illustrated in FIG. 2C, since the fourth semiconductor $P^+$-region 8a is electrically connected to the fifth semiconductor $P^+$-region 10, the potential of the fourth semiconductor $P^+$-region 8a is set to the plus voltage VH.

Regarding the potential distribution diagram in this state, a potential of Vg in the light-reflection conductive layer 99a is increased, via a potential of VH in the fourth semiconductor $P^+$-region 8a, to a potential of Vs in an area where the signal charges Qsig are stored. In an area where the signal charges Qsig are stored, a constant potential of Vs is maintained. Then, toward the second semiconductor P-region 3, the potential becomes shallower to a potential of Vp in the second semiconductor P-region 3.

In this state, a large number of positive holes (holes) supplied from the fifth semiconductor $P^+$-region 10 exist in the fourth semiconductor $P^+$-region 8a. Thus, as in the state illustrated in FIG. 2D, when the electrons 56c located at the energy level at the phase boundary between the insulating layer 4a and the fourth semiconductor $P^+$-region 8a are thermally excited by a conduction-band, the electrons 56c are recombined with the positive holes 56d existing in the fourth semiconductor $P^+$-region 8a and disappear. Consequently, the excited electrons 56c are not mixed into the signal charges Qsig, and no dark current or dark current noise is generated.

As described above, in the solid-state imaging device according to this embodiment, since the electrons 56c disappear due to the recombination with the positive holes 56d even when the potential of the fourth semiconductor $P^+$-region 8a is changed, a state in which no dark current or dark current noise is generated can be maintained. In addition, since the potential of the fourth semiconductor $P^+$-region 8a is kept at the potential of the fifth semiconductor $P^+$-region 10 even when the potential of the light-reflection conductive layer 99a is changed, even when the electrons 56c located at the energy level at the phase boundary between the insulating layer 4a and the fourth semiconductor $P^+$-region 8a are thermally excited by a conduction-band, the electrons 56c are recombined with the positive holes 56d existing in the fourth semiconductor $P^+$-region 8a and disappear. Thus, a state in which no dark current or dark current noise is generated can be maintained.

As described above, since the fourth semiconductor $P^+$-region 8a is electrically connected to the fifth semiconductor $P^+$-region 10, a large number of positive holes supplied from the fifth semiconductor $P^+$-region 10 exist in the fourth semiconductor $P^+$-region 8a at the time of the signal charge reading operation and the stored signal charge discharging operation as well as the single charge storing operation. Thus, the electrons 56c that are thermally excited by a conduction-band from the phase boundary between the insulating layer 4a and the fourth semiconductor $P^+$-region 8a are recombined with the positive holes 56d existing in the fourth semiconductor $P^+$-region 8a and disappear. As a result, generation of dark current and dark current noise can be prevented.

Figure 2F:
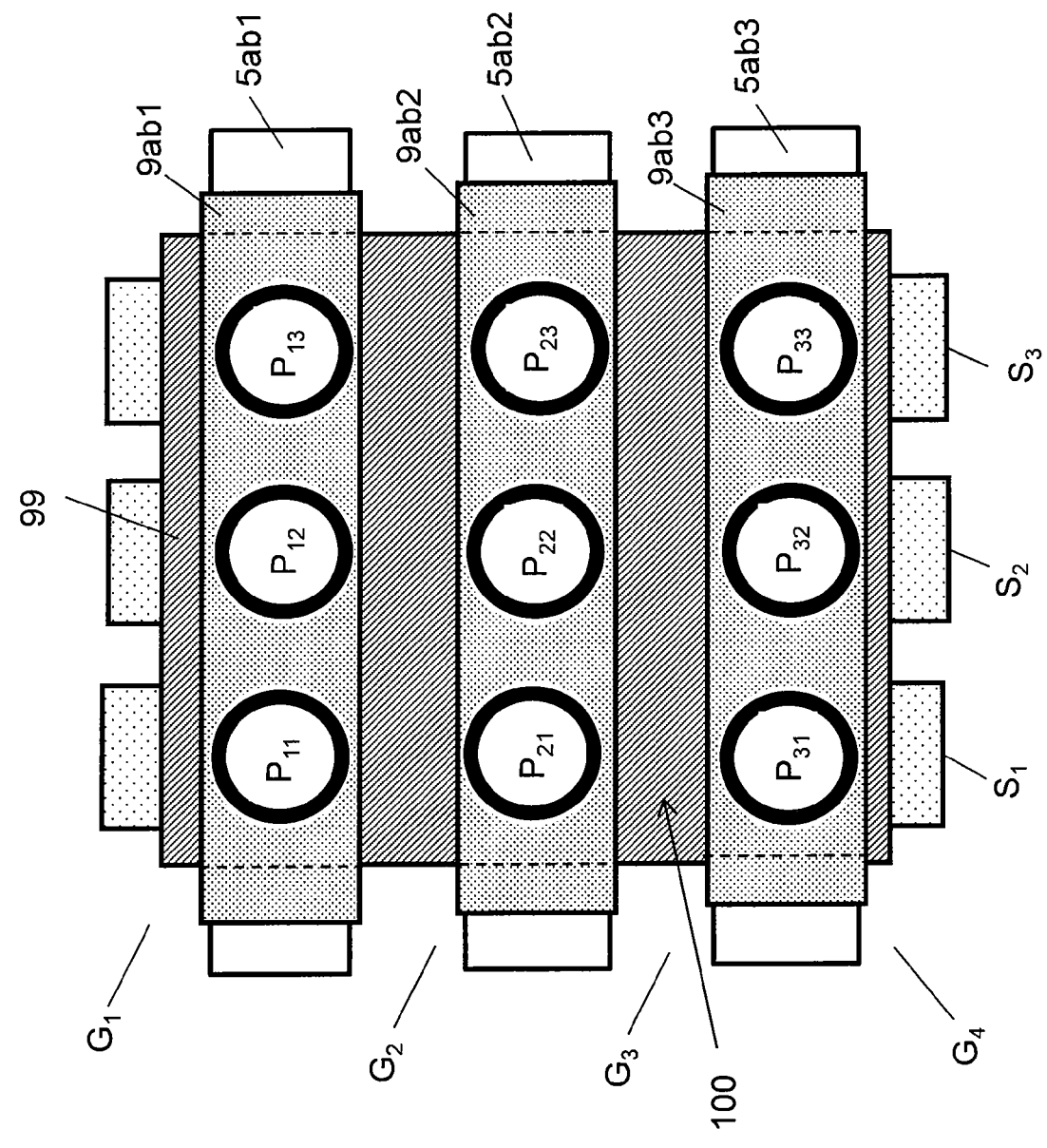
FIG. 2F is a schematic plan view of the solid-state imaging device according to the second embodiment when viewed from a light incidence surface side.

FIG. 2F is a schematic plan view of the solid-state imaging device according to this embodiment illustrated in FIG. 2C when viewed from the light incidence surface side. As illustrated in FIG. 2F, the light-reflection conductive layers 99c and 99d that are connected to the light-reflection conductive layers 99a and 99b illustrated in FIG. 2C extend so as to cover the entire pixel region to form a light-reflection conductor connected layer 99. The pixel-selecting lines (metallic layers) 9ab1, 9ab2, and 9ab3 (corresponding to the metallic layers 10aa and 10bb in FIG. 2C) are isolated from the light-reflection conductive layers 99a and 99b and the light-reflection conductive layers 99c and 99d and are formed so as to extend in the row direction of the island-shaped semiconductors P11 to P33 arranged in a matrix. The MOS gate wires 5ab1, 5ab2, and 5ab3 and the signal line semiconductor $N^+$-regions $S_1$, $S_2$, and $S_3$ are also formed in a similar manner as in FIG. 1B. The light-reflection conductor connected layer 99 shields the pixel region except for the upper surface of the island-shaped semiconductors $P_{11}$ to $P_{33}$ constituting pixels from light. Thus, due to the light-reflection conductor connected layer 99 that extends so as to surround the outer periphery of the island-shaped semiconductors $P_{11}$ to $P_{33}$, an incident light beam 100 that is incident to gaps $G_1$ to $G_4$ formed in the row direction of the island-shaped semiconductors $P_{11}$ to $P_{33}$ constituting pixels is prevented from entering the structure via the gaps $G_1$ to $G_4$. Thus, a reduction in the resolution and color mixture in color imaging, which occur in a solid-state imaging device of related art, can be prevented.

Hereinafter, a modification of the second embodiment will be described with reference to FIGS. 3A and 3B.

Figure 3B:
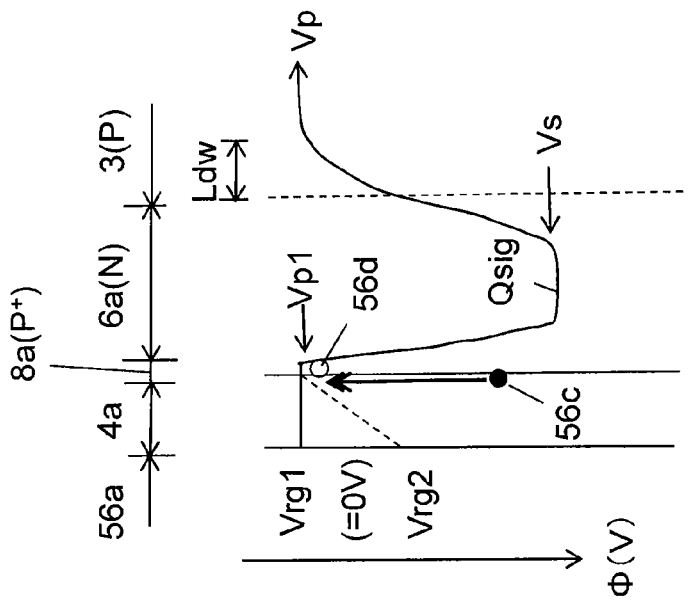
FIG. 3B is a potential distribution diagram illustrating a portion taken along line C-C' in FIG. 3A.
Figure 3A:
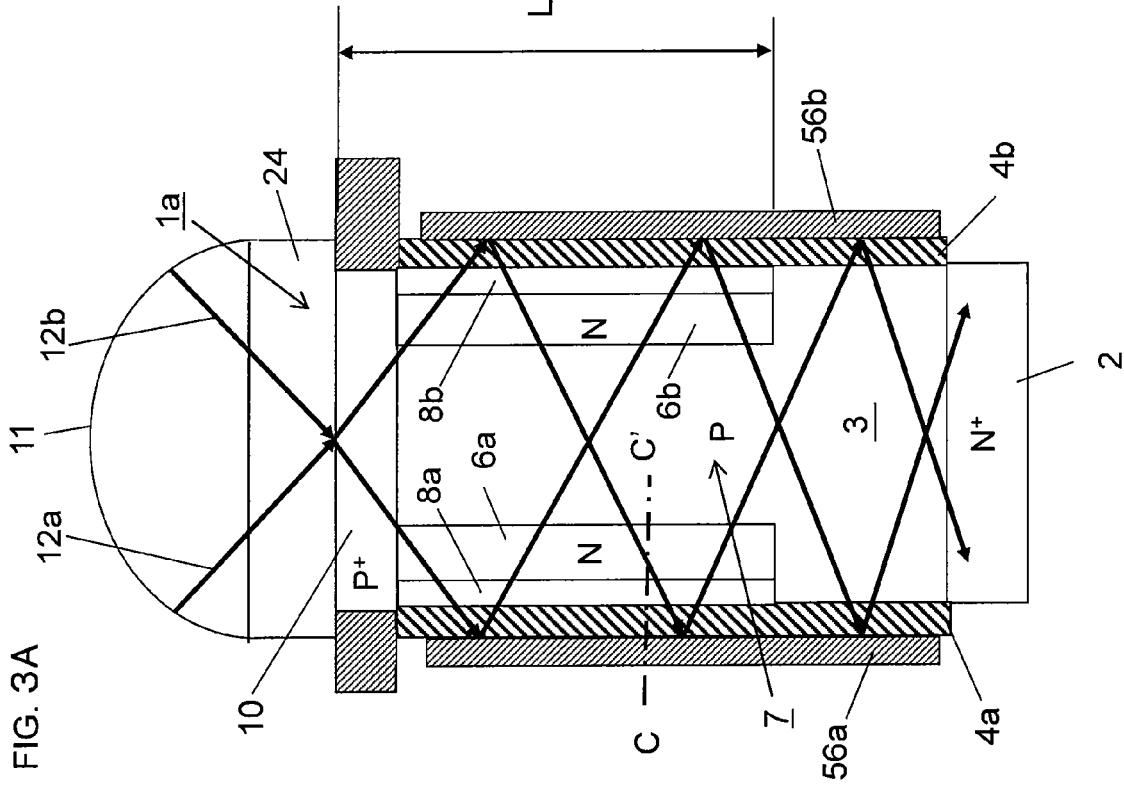
FIG. 3A is a cross-section diagram illustrating the pixel structure of a solid-state imaging device according to a modification of the second embodiment.

FIG. 3A illustrates the pixel structure of a solid-state imaging device according to the modification of this embodiment. In FIG. 2C, the light-reflection conductive layers 99a and 99b that are isolated from the gate conductive layers 5a and 5b and the metallic layers (pixel-selecting lines) 10aa and 10bb are formed on the outer periphery of the third semiconductor N-regions 6a and 6b and the fourth semiconductor P+-regions 8a and 8b. However, in the pixel structure of the modification illustrated in FIG. 3A, gate conductive layers 56a and 56b are formed so as to extend to the outer periphery of the third semiconductor N-regions 6a and 6b and the fourth semiconductor P+-region 8a. The other components are the same as those in the cross-sectional structure illustrated in FIG. 2C. Thus, the explanations of the portions referred to with the same reference numeral and signs will be omitted, except for the explanation provided below.

FIG. 3B illustrates a potential distribution diagram illustrating a portion taken along line C-C' in FIG. 3A at the time of a signal charge storing operation of the solid-state imaging device according to this embodiment. In a state illustrated in FIG. 3B, a ground voltage of Vrg1 (=0V) is applied to the gate conductive layer 56a at the time of the signal charge storing operation, and a plus voltage of Vrg2 is applied to the gate conductive layer 56a at the time of the stored signal charge discarding operation. In FIG. 3B, the potential distribution diagram in a case where Vrg1 is applied to the gate conductive layer 56a is represented by the solid line, and the potential diagram in the insulating layer 4a in a case where Vrg2 is applied to the gate conductive layer 56a is represented by the dotted line. As illustrated in FIG. 3B, in a state where the signal charges Qsig are stored in the third semiconductor N-region 6a, from the fourth semiconductor P+-region 8a toward the third semiconductor N-region 6a, the potential becomes deeper to a potential of Vs where the signal charges Qsig are stored. In the area where the signal charges Qsig are stored, a constant voltage of Vs is maintained. Then, toward the second semiconductor P-region 3, the potential becomes shallower to a voltage of Vp in the second semiconductor P-region 3.

As illustrated in FIG. 3A, since the fourth semiconductor P+-region 8a is electrically connected to the fifth semiconductor P+-region 10, a potential of Vp1 in the fourth semiconductor P+-region 8a is the same as that of the fifth semiconductor P+-region 10. Thus, even when the potential of the gate conductive layer 56a is changed from Vrg1 to Vrg2 (>Vrg1) at the time of the stored signal charge discarding operation, since the fourth semiconductor P+-region 8 is connected to the fifth semiconductor P+-region 10, the potential is fixed at Vp1. Therefore, a large number of positive holes (holes) 56d supplied from the fifth semiconductor P+-region 10, which is an acceptor region, exist in the fourth semiconductor P+-region 8a. Similarly, at the time of the signal charge reading operation, since the fourth semiconductor P+-region 8 is connected to the fifth semiconductor P+-region 10, a large number of positive holes (holes) 56d supplied from the fifth semiconductor P+-region 10 exist in the fourth semiconductor P+-region 8a. Thus, as in the state illustrated in FIGS. 2D and 2E, when the electrons 56c located at the energy level at the phase boundary between the insulating layer 4a and the fourth semiconductor P+-region 8a are thermally excited by a conduction-band, the electrons 56c are recombined with the positive holes 56d existing in the fourth semiconductor P+-region 8a and disappear. Therefore, the excited electrons 56c are not mixed into the signal charges Qsig, and no dark current or dark current noise is generated. Consequently, in the solid-state imaging device according to this embodiment, even when the potential of the gate conductive layer 56a is changed, a state where no dark current or dark current noise is generated can be maintained.

Hereinafter, another modification of the second embodiment will be described with reference to FIGS. 4A and 4B.

Figure 4B:
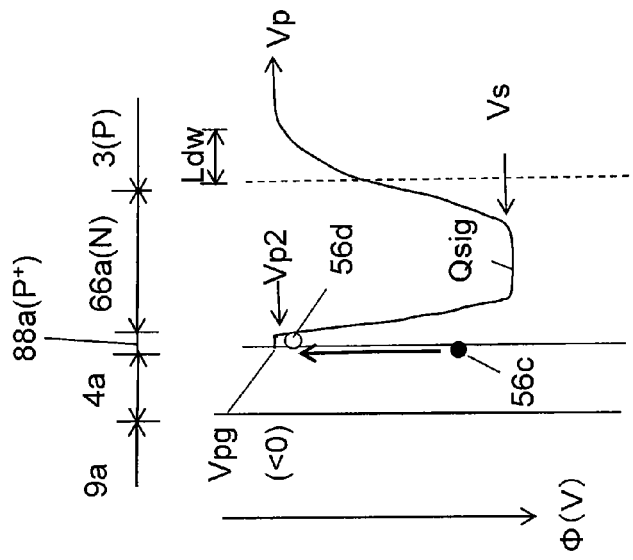
FIG. 4B is a potential distribution diagram illustrating a portion taken along line D-D' in FIG. 4A.
Figure 4A:
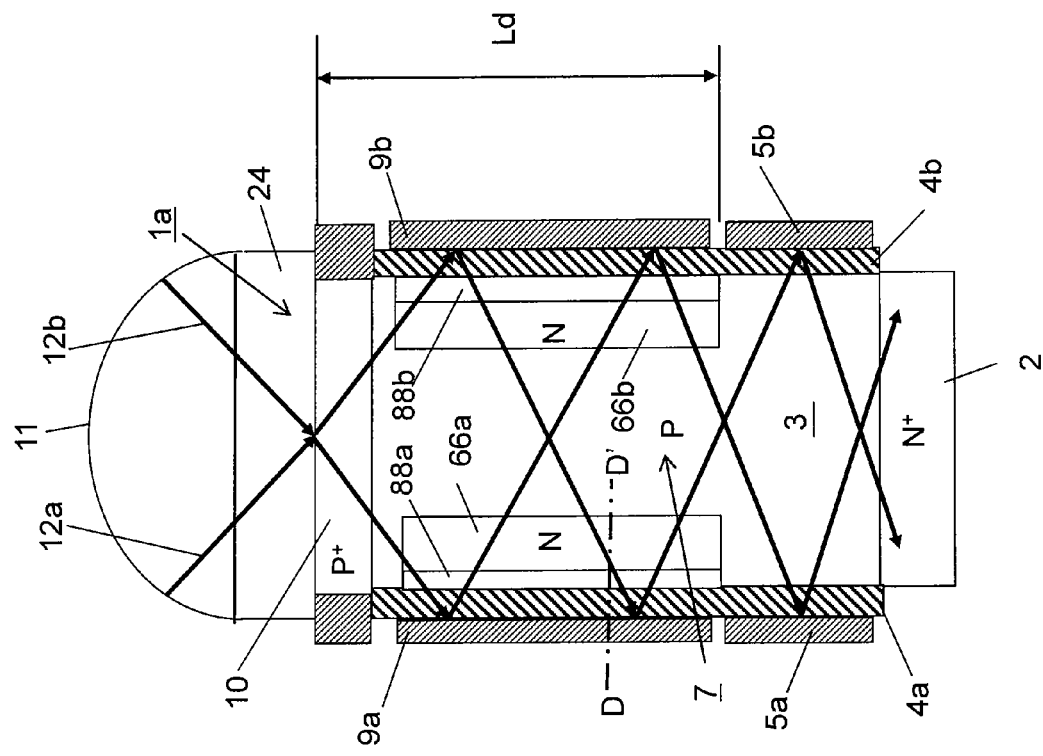
FIG. 4A is a cross-section diagram illustrating the pixel structure of a solid-state imaging device according to a modification of the second embodiment.

FIG. 4A illustrates the pixel structure of a solid-state imaging device according to a modification of this embodiment. In FIG. 2C, the fourth semiconductor P+-regions 8a and 8b formed on the outer periphery of the third semiconductor N-regions 6a and 6b and the third semiconductor N-regions 6a and 6b are electrically connected to the fifth semiconductor P+-region 10. However, in the pixel structure of this modification, fourth semiconductor P+-regions 88a and 88b and third semiconductor N-regions 66a and 66b are electrically isolated from the fifth semiconductor P+-region 10. The light-reflection conductive layers 9a and 9b are formed on the outer periphery of the third semiconductor N-regions 66a and 66b and the fourth semiconductor P+-regions 88a and 88b with the insulating layers 4a and 4b therebetween. The other components are the same as those in the cross-sectional structure illustrated in FIG. 2C. Thus, the explanation of the portions referred to with the same reference numeral and signs will be omitted, except for the explanation provided below.

FIG. 4B is a potential distribution diagram illustrating a portion taken along line D-D' in FIG. 4A at the time of a signal charge storing operation of the solid-state imaging device according to this embodiment. In the state illustrated in FIG. 4B, a minus voltage of Vpg (<0 V=Vp) is applied to the light-reflection conductive layers 9a and 9b so that the fourth semiconductor P+-regions 88a and 88b achieve a positive-hole storage state (a state where a large number of positive holes supplied from the second semiconductor P-region 3 exist). The potential of the fourth semiconductor P+-regions 88a and 88b is set to Vp2 ($\cong$0V). As illustrated in FIG. 4B, in a state where the signal charges Qsig are stored in the third semiconductor N-region 66a, from the fourth semiconductor P+-region 88a (88b) toward the third semiconductor N-region 66a, a potential of Vp2 becomes deeper to a potential of Vs where the signal charges Qsig are stored. In the area where the signal charges Qsig are stored, a constant voltage of Vs is maintained. Then, toward the second semiconductor P-region 3, the potential becomes shallower to a potential of Vp in the second semiconductor P-region 3.

In the pixel structure illustrated in FIG. 4A, since the fourth semiconductor P+-regions 88a and 88b are electrically isolated from the fifth semiconductor P+-region 10, the potential of the fourth semiconductor P+-regions 88a and 88b is not necessarily the same as the potential of the fifth semiconductor P+-region 10.

In this case, a large number of positive holes supplied from the second semiconductor P-region 3 exist in the fourth semiconductor P+-regions 88a and 88b. Thus, as in the state illustrated in FIG. 3B, when the electrons 56c located at the energy level at the phase boundary between the insulating layer 4a and the fourth semiconductor P+-region 88a (88ba) are thermally excited by a conduction-band, the electrons 56c are recombined with the positive holes 56d existing in the fourth semiconductor P+-region 88a (88b) and disappear. Therefore, the excited electrons 56c are not mixed into the signal charges Qsig, and no dark current or dark current noise is generated.

As explained with reference to FIGS. 2C, 3A, and 4A, by forming the fourth semiconductor $P^+$-regions 8a, 8b, 88a, and 88b on the outer periphery of the third semiconductor N-regions 6a, 6b, 66a, and 66b, forming the light-reflection conductive layers 99a and 99b, the gate conductive layers 56a and 56b, and the light-reflection conductive layers 9a and 9b on the outer periphery of the third semiconductor N-regions 6a, 6b, 66a, and 66b with the insulating layers 4a and 4b therebetween, and achieving a state where a large number of positive holes exist in the fourth semiconductor $P^+$-regions 8a, 8b, 88a, and 88b at the time of the signal charge storing operation, the time of the signal charge reading operation, and the time of the stored signal charge discharging operation of the solid-state imaging device, not only realization of a higher pixel density and a higher sensitivity and suppression of a reduction of the resolution and generation of color mixture in color imaging, which are problems in a solid-state imaging device according to related art, can be achieved, but generation of dark current and dark current noise can also be prevented.

Embodiment 3

Figure 5A:
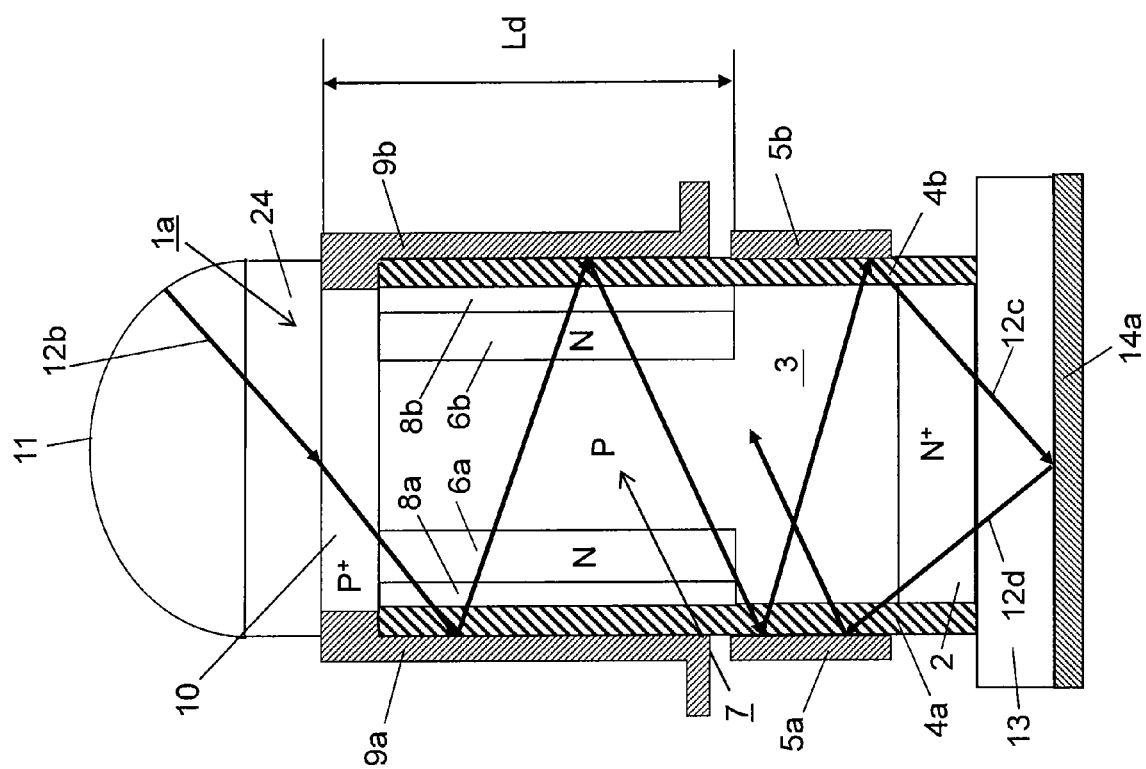
FIG. 5A is a cross-section diagram illustrating the pixel structure of a solid-state imaging device according to a third embodiment of the present invention.
Figure 5B:
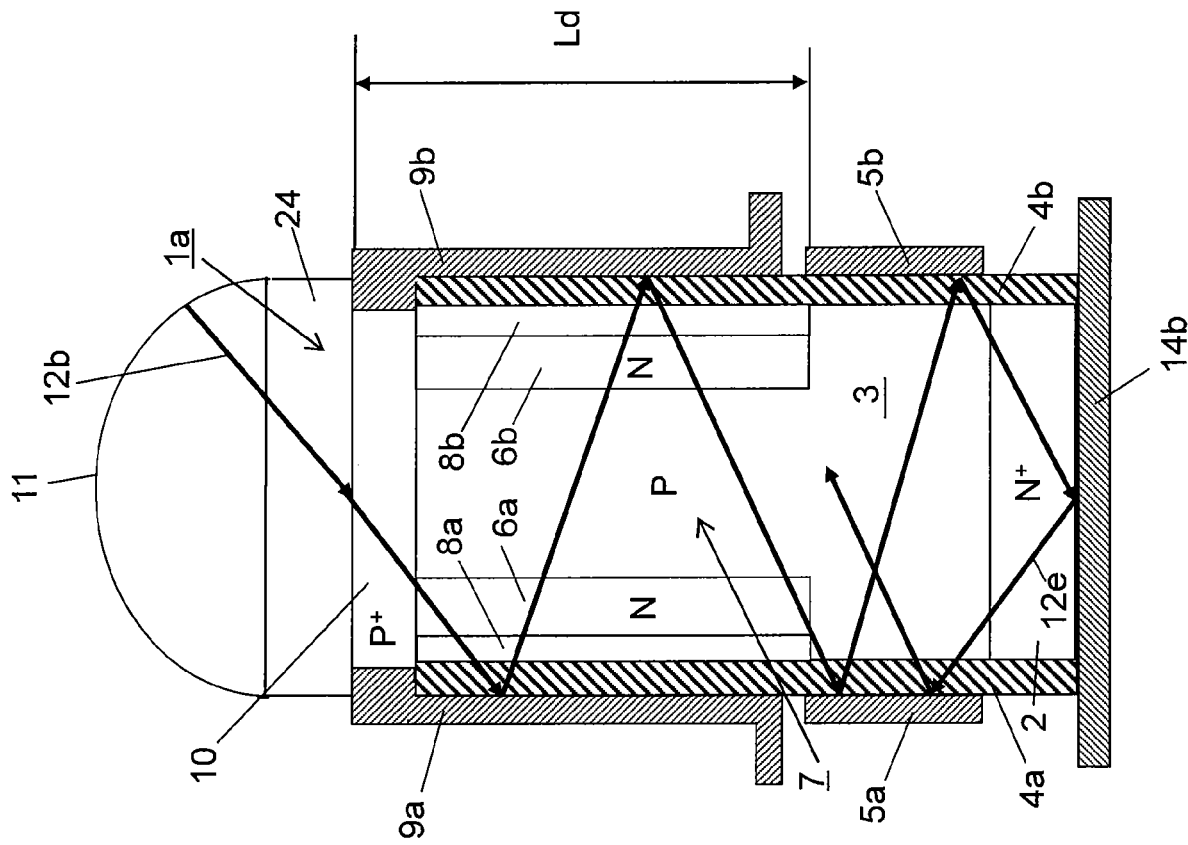
FIG. 5B is a cross-section diagram illustrating the pixel structure of a solid-state imaging device according to a modification of the third embodiment.

FIG. 5A and FIG. 5B illustrate the pixel structure of a solid-state imaging device according to a third embodiment of the present invention and the pixel structure of a solid-state imaging device according to a modification of the third embodiment.

In the solid-state imaging device according to this embodiment illustrated in FIG. 5A, an insulating layer 13 is formed below the island-shaped semiconductor 1a in the solid-state imaging device according to the first embodiment illustrated in FIG. 1A and a light-reflection conductive layer 14a that is made of metal or the like, that reflects light, and that is formed of a conductor is formed below the insulating layer 13. A light beam 12b incident from the upper surface of the microlens 11 is reflected by the light-reflection conductive layers 9a and 9b and the gate conductive layers 5a and 5b and is propagated below the island-shaped semiconductor 1a. A light beam 12c incident to the insulating layer 13 is reflected by the light-reflection conductive layer 14a, and a reflected light beam 12d reaches again the photodiode region 7 in the island-shaped semiconductor 1a constituting a pixel, and generates signal charges. This means that, compared to the solid-state imaging device according to the first embodiment illustrated in FIG. 1A, in a case where the sensitivity of the solid-state imaging device according to this embodiment is the same as that of the solid-state imaging device according to the first embodiment, the height Ld of the photodiode region 7 can further be reduced compared to that in the solid-state imaging device according to the first embodiment. Consequently, fabrication of the pixel structure can be easily performed, thus realizing an increase in the pixel density of the solid-state imaging device.

In the solid-state imaging device according to this embodiment, since the light propagation length in the photodiode region 7, which is a light-sensitive region, can be increased even when the height Ld of the photodiode region 7 is the same as that of the solid-state imaging device according to the first embodiment, signal charges generated by the reflected light beam 12d reflected by the light-reflection conductive layer 14a can contribute to an improvement in the sensitivity.

In the modification of this embodiment illustrated in FIG. 5B, the light-reflection conductive layer 14b is directly formed below the island-shaped semiconductor 1a illustrated in FIG. 1A without an insulating layer therebetween. With this pixel structure, a reflected light beam 12e reflected by the light-reflection conductive layer 14b is incident again to the photodiode region 7 of the island-shaped semiconductor 1a constituting a pixel and signal charges are generated. Consequently, effects similar to those achieved in the solid-state imaging device according to the second embodiment illustrated in FIG. 2A can be achieved.

Consequently, according to the second embodiment and the modification thereof, a solid-state imaging device achieving a higher pixel density, a higher resolution, less color mixture, and a higher sensitivity can be realized.

Embodiment 4

Figure 6A:
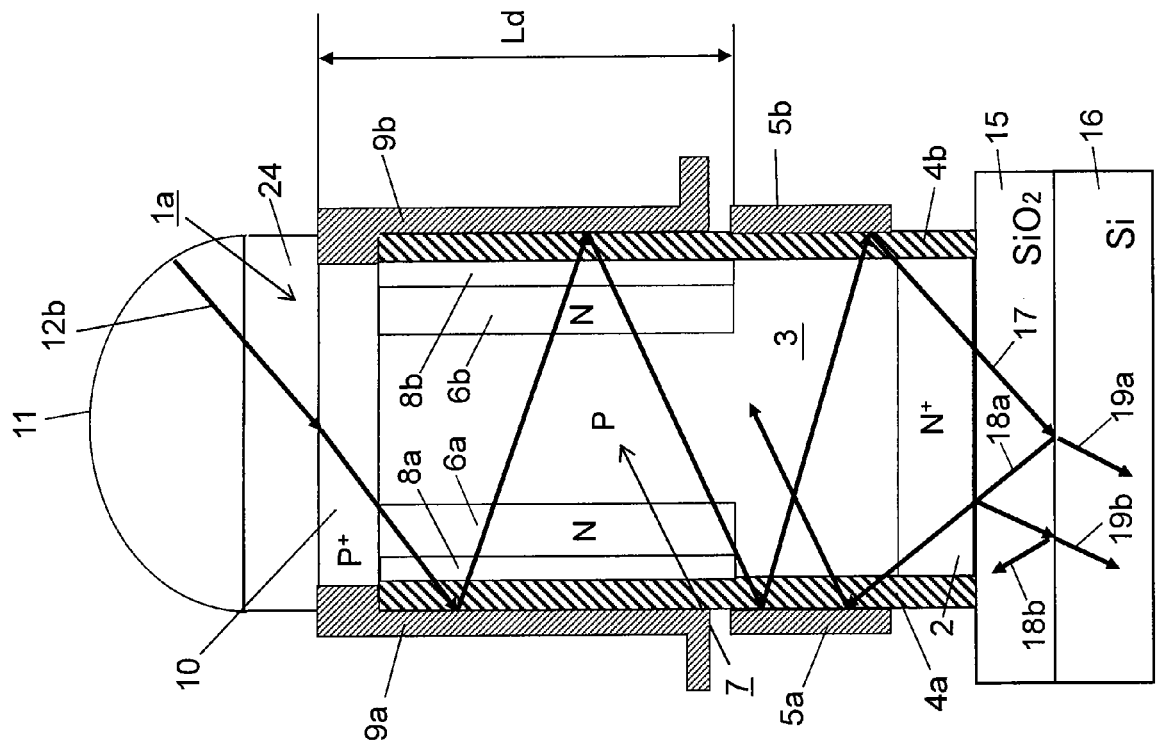
FIG. 6A is a cross-section diagram illustrating the pixel structure of a solid-state imaging device according to a fourth embodiment of the present invention.

FIG. 6A illustrates the pixel structure of a solid-state imaging device according to a fourth embodiment of the present invention. As illustrated in FIG. 6A, the solid-state imaging device according to this embodiment has a pixel structure similar to that of the solid-state imaging device according to the first embodiment with the exception in that a light-transmission insulating layer 15 made of an $SiO_2$ film or the like is formed below the island-shaped semiconductor 1a constituting a pixel of the solid-state imaging device according to the first embodiment illustrated in FIG. 1A and that a light-absorption layer 16 that is made of Si (silicon) or the like and that absorbs part of incident light beams is formed below the light-transmission insulating layer 15.

A light beam 17 incident to the light-transmission insulating layer 15 causes multiple reflection inside the light-transmission insulating layer 15, and reflected light beams 18a, 18b, . . . reflected by the surface of the light-absorption layer 16 and incident light beams 19a, 19b, . . . incident to the light-absorption layer 16 are generated, as illustrated in FIG. 6A. In this case, the amount of light that is multiple-reflected inside the light-transmission insulating layer 15 and that is returned to the photodiode region 7 varies depending on the thickness of the light-transmission insulating layer 15, the light-absorption ratios of Si and $SiO_2$, the refractive indices, the wavelength of an incident light beam, the incidence angle, and the like.

Figure 6B:
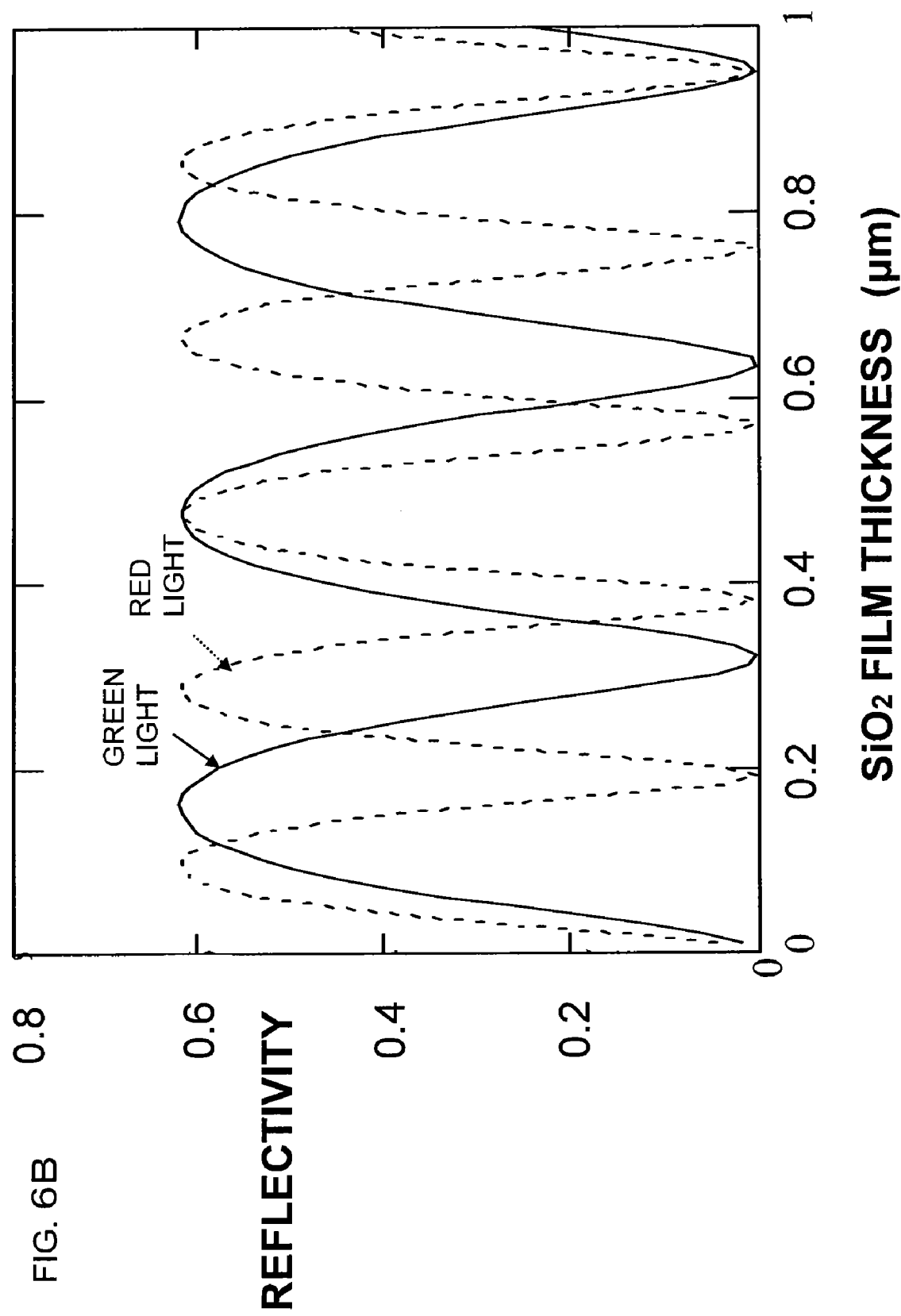
FIG. 6B is a graph illustrating the result obtained by calculating the dependency of the reflectivity of green light and red light on the surface of a light-transmission insulating layer ($SiO_2$ layer) on the thickness of the light-transmission insulating layer in the solid-state imaging device according to the fourth embodiment.

FIG. 6B illustrates, in the form of a graph, the result obtained by calculating the dependency of the reflectivity on the film thickness of the $SiO_2$ layer 15 when green light ($\lambda$=550 nm) and red light ($\lambda$=650 nm) incident to the surface of the light-transmission insulating layer ($SiO_2$ layer) 15 at an angle of 45 degrees are reflected by the Si light-absorption layer 16 in the solid-state imaging device according to this embodiment. Since blue light is absorbed in a portion of the photodiode region 7 near the surface of the island-shaped semiconductor 1a, the dependency on the film thickness is not found. The reflectivity represents the ratio of the amount of light returned to the photodiode region 7 to the amount of light incident to the light-transmission insulating layer 15. As illustrated in FIG. 6B, the reflectivity of green light and red light increases or decreases depending on the thickness of the $SiO_2$ layer 15. For example, when the thickness of the $SiO_2$ film is set to approximately 0.5 μm, the reflectivity of each of green light and red light can be relatively increased. In contrast, for example, when the thickness of the $SiO_2$ film is set to approximately 0.2 μm, the reflectivity of green light can be relatively increased and the reflectivity of red light can be relatively decreased. By changing the thickness of the $SiO_2$ film as described above, in signal processing that requires adjustment of the balance of signal outputs among blue light, green light, and red light in color imaging, setting the thickness of the $SiO_2$ film to approximately 0.2 μm to increase the sensitivity of green light and decrease the sensitivity of red light can contribute to the improvement in the sensitivity of a color solid-state imaging device. In addition, setting the thickness of the $SiO_2$ film to approximately 0.5 μm to increase the reflectivity of each of green light and red light can contribute to the improvement in the sensitivity in black-and-white imaging. Accordingly, being capable of changing the reflectivity according to the wavelength of light by changing the thickness of the $SiO_2$ layer 15 means being capable of controlling the spectral sensitivity characteristics representing the relationship between the wavelength of an incident light beam and the sensitivity of a solid-state imaging device by changing the thickness of the $SiO_2$ film.

In actual solid-state imaging devices, light is incident to the surface of the light-transmission insulating layer ($SiO_2$ layer) 15 at various incidence angles and the characteristics illustrated in FIG. 6B change according to the design of a microlens. In addition, required spectral sensitivity characteristics differ between color imaging and black-and-white imaging. Consequently, the technique for chancing the thickness of the light-transmission insulating layer ($SiO_2$ layer) 15 to change the reflectivity according to the wavelength of light provides an effective approach for achieving desired spectral sensitivity characteristics.

Embodiment 5

Figure 7A:
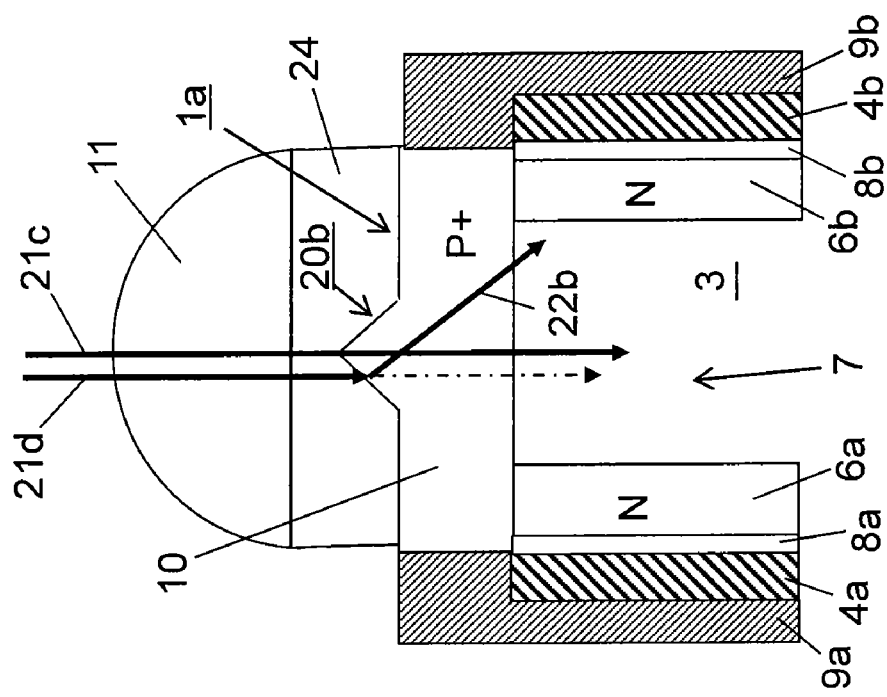
FIG. 7A is a cross-section diagram illustrating a pixel structure of a solid-state imaging device according to a fifth embodiment of the present invention.
Figure 7B:
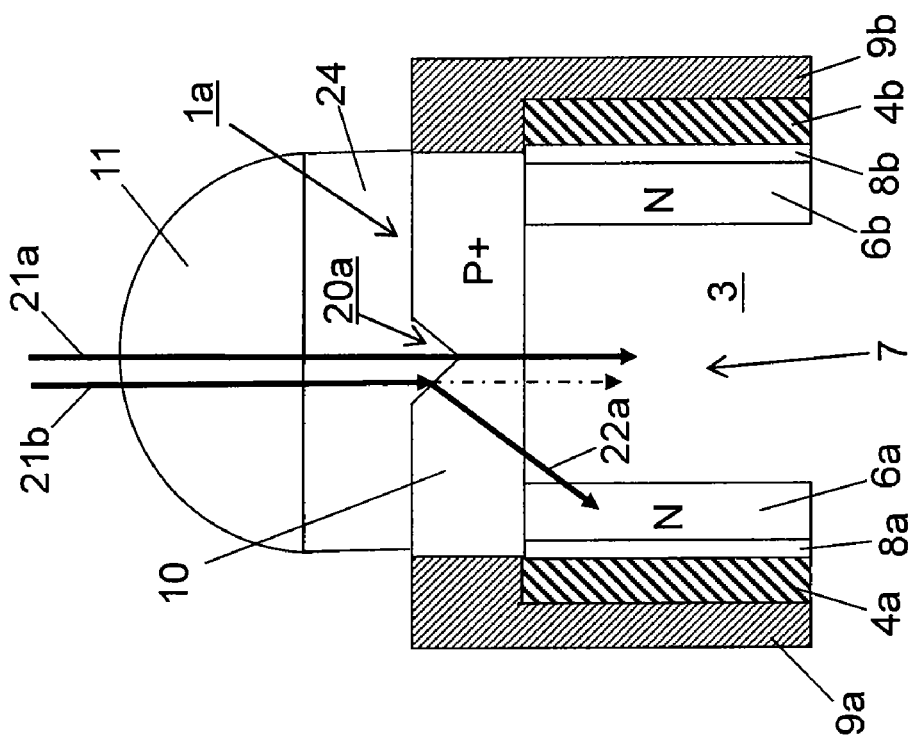
FIG. 7B is a cross-section diagram illustrating another pixel structure of the solid-state imaging device according to the fifth embodiment.

FIGS. 7A and 7B illustrate the pixel structure of a solid-state imaging device according to a fifth embodiment of the present invention.

As illustrated in FIGS. 7A and 7B, the solid-state imaging device according to this embodiment has a pixel structure similar to that of the solid-state imaging device according to the first embodiment with the exception in that a recessed portion 20a or a protruding portion 20b is formed in a central surface portion of the fifth semiconductor $P^+$-region 10 in the pixel (island-shaped semiconductor) 1a of the solid-state imaging device according to the first embodiment illustrated in FIG. 1A and that the optical refractive indices of two material regions being in contact with each other across the recessed surface of the recessed portion 20a or the protruding surface of the protruding portion 20b as a boundary surface are made to differ from each other.

FIG. 7A illustrates an example of a case where the recessed portion 20a having a triangular pyramid shape is formed in the central surface portion of the fifth semiconductor $P^+$-region 10 in the island-shaped semiconductor 1a constituting a pixel.

In the pixel structure of the first embodiment illustrated in FIG. 1A, the recessed portion 20a does not exist in the central surface portion of the fifth semiconductor $P^+$-region 10. Thus, light beams 21a and 21b perpendicularly incident to a central portion of the microlens 11 are directly incident inside the island-shaped semiconductor 1a constituting a pixel without being reflected by the light-reflection conductive layers 9a and 9b. Therefore, for the light beams 21a and 21b perpendicularly incident to the central portion of the microlens 11, an effect of an increase in the light propagation length in the photodiode region 7 by reflection by the light-reflection conductive layers 9a and 9b cannot be achieved.

In contrast, in the pixel structure illustrated in FIG. 7A, except for the light beam 21a incident along the centerline of the microlens 11, the light beams 21b perpendicularly incident from the central portion of the microlens 11 to the fifth semiconductor $P^+$-region 10 is refracted by the recessed portion 20a toward the light-reflection conductive layers 9a and 9b. Accordingly, a refracted light beam 22a is reflected by the light-reflection conductive layers 9a and 9b, and the light propagation length in the photodiode region 7 is increased, thus improving the sensitivity of the solid-state imaging device. The refraction of a light beam at the recessed portion 20a is generated by the contrast between the refractive index of Si (silicon), which is a material of the fifth semiconductor $P^+$-region 10, and the refractive index of a transparent resin material, which is a material of the light-transmission intermediate region 24.

FIG. 7B illustrates an example of a case where the protruding portion 20b having a triangular pyramid shape is formed in the central surface portion of the fifth semiconductor $P^+$-region 10.

As illustrated in FIG. 7B, instead of the recessed portion 20a illustrated in FIG. 7A, the protruding portion 20b may be formed in the central surface portion of the fifth semiconductor $P^+$-region 10. Also in this case, except for a light beam 21c incident along the centerline of the microlens 11, a light beam 21d perpendicularly incident from the central portion of the microlens 11 to the fifth semiconductor $P^+$-region 10 is refracted by the protruding portion 20b toward the light-reflection conductive layers 9a and 9b. Accordingly, a refracted light beam 22a is reflected by the light-reflection conductive layers 9a and 9b, and the light propagation length in the photodiode region 7 is increased, thus improving the sensitivity of the solid-state imaging device.

In this embodiment, the optical refractive indices of two material regions being in contact with each other across the recessed surface of the recessed portion 20a or the protruding surface of the protruding portion 20b as a boundary surface are made to differ from each other. However, not limited to this, the recessed portion 20a or the protruding portion 20b itself may be formed of a material having a refractive index different from that of Si, which is a material of the fifth semiconductor $P^+$-region 10, or a transparent resin material of the light-transmission intermediate region 24. Also from this, a light beam incident from the central portion of the microlens 11 to the fifth semiconductor $P^+$-region 10 is refracted by the recessed portion 20a or the protruding portion 20b toward the light-reflection conductive layers 9a and 9b. Thus, the light propagation length in the photodiode region 7, which is a light-sensitive region, is increased, and the sensitivity of the solid-state imaging device is improved.

In this embodiment, with reference to FIGS. 7A and 7B, the shape of each of the recessed portion 20a and the protruding portion 20b is a triangular pyramid shape. However, not limited to this, any other shapes, such as a conical shape, a quadrangular pyramid shape, and a semicircle shape, are possible as long as a light beam incident to the central portion of the microlens 11 is refracted by the recessed portion 20a or the protruding portion 20b and is reflected by a light-reflection conductive layer.

Embodiment 6

Figure 8:
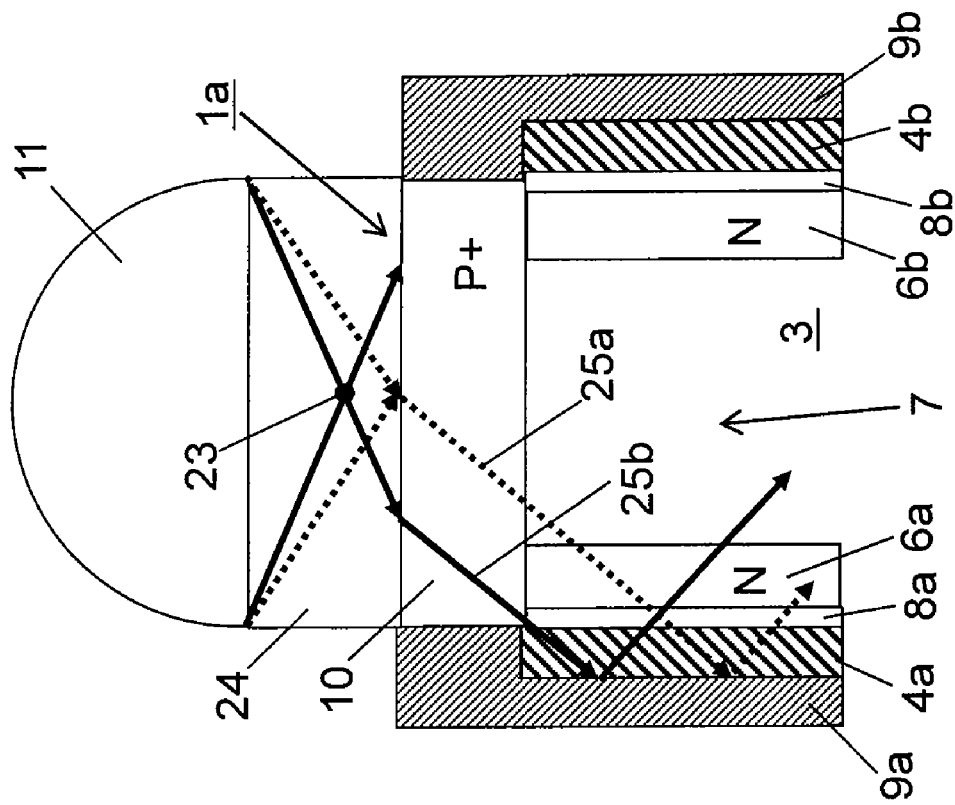
FIG. 8 is a cross-section diagram illustrating the pixel structure of a solid-state imaging device according to a sixth embodiment of the present invention.

FIG. 8 illustrates the pixel structure of a solid-state imaging device according to a sixth embodiment of the present invention. As illustrated in FIG. 8, the solid-state imaging device according to this embodiment has a pixel structure similar to that of the solid-state imaging device according to the first embodiment with the exception in that a focal point 23 of the microlens 11 is located inside the light-transmission intermediate region 24, which is upper than the upper surface of the fifth semiconductor $P^+$-region 10, in the island-shaped semiconductor 1a constituting a pixel of the solid-state imaging device according to the first embodiment illustrated in FIG. 1A.

In the pixel structure illustrated in FIG. 8, the focal point 23 of the microlens 11 is formed inside the light-transmission intermediate region 24, which is upper than the fifth semiconductor P⁺-region 10.

Since the solid-state imaging device according to this embodiment has such a pixel structure, the position in the light-reflection conductive layers 9a and 9b at which an incident light beam 25b that is incident from the microlens 11 and is collected at the focal point 23 inside the light-transmission intermediate region 24 first reaches is close to the upper surface of the fifth semiconductor P⁺-region 10, compared to an incident light beam 25a in the case where the focal point is located on the upper surface of the fifth semiconductor P⁺-region 10 (case of the pixel structure in the first embodiment). This means that the light propagation length in the photodiode region 7 of the incident light beam 25b in the pixel structure in this embodiment is much longer than that of the incident light beam 25a in the pixel structure in the first embodiment. Therefore, the sensitivity of the solid-state imaging device of this embodiment is much improved compared to the solid-state imaging device of the first embodiment.

In the pixel structure illustrated in FIG. 8, for the light beams 21b and 21d incident to the central portion of the microlens 11 illustrated in FIGS. 7A and 7B, an effect of increasing the light propagation length in the photodiode region 7 cannot be achieved. Thus, by applying the configuration in the fifth embodiment explained with reference to FIGS. 7A and 7B (the recessed portion 20a or the protruding portion 20b formed in the central portion of the fifth semiconductor P⁺-region 10) to the sixth embodiment, a further improvement in the sensitivity of the solid-state imaging device can be achieved.

Embodiment 7

Figure 9:
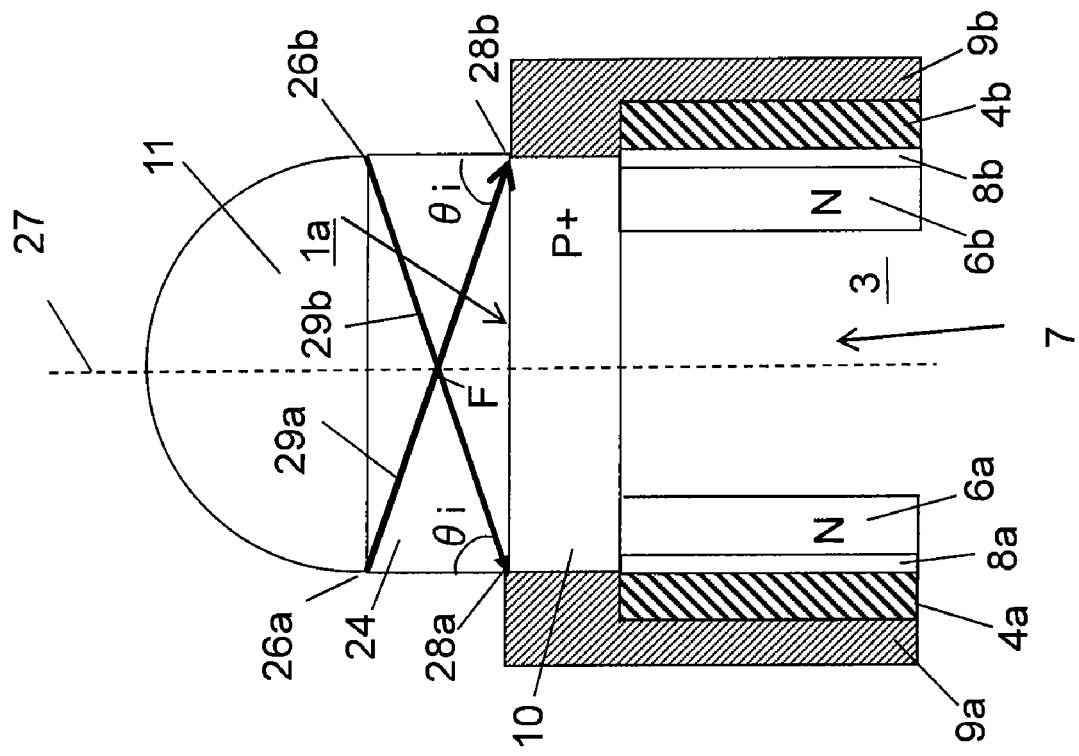
FIG. 9 is a cross-section diagram illustrating the pixel structure of a solid-state imaging device according to a seventh embodiment of the present invention.

FIG. 9 illustrates the pixel structure of a solid-state imaging device according to a seventh embodiment of the present invention. As illustrated in FIG. 9, the solid-state imaging device according to this embodiment is characterized in that an angle θi formed between each of light beams 29a and 29b that are incident from points 26a and 26b on the outer periphery of the microlens 11, that are transmitted through a centerline 27 of the microlens 11, and that reach points 28a and 28b on the outer periphery of the fifth semiconductor P⁺-region 10 and a line that is orthogonal to the upper surface of the fifth semiconductor P⁺-region 10 is smaller than a Brewster angle θb in the island-shaped semiconductor 1a constituting a pixel of the solid-state imaging device according to the first embodiment illustrated in FIG. 1A.

Figure 13:
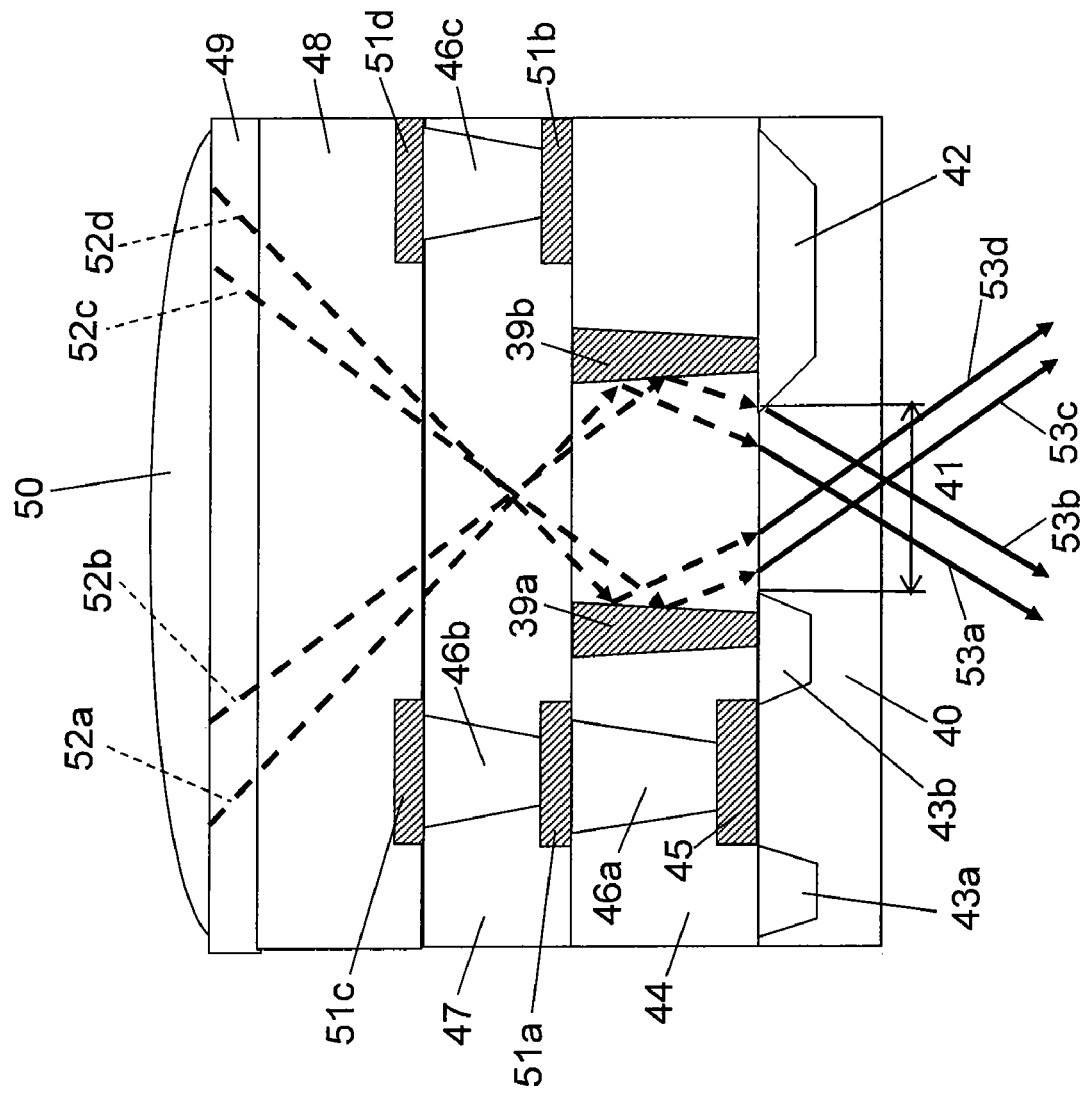
FIG. 13 is a cross-section diagram illustrating the pixel structure of a solid-state imaging device according to another example of related art.

In the solid-state imaging devices according to the examples of related art illustrated in FIGS. 12A and 13, since the photodiode region is not completely surrounded by a material that reflects light, a light beam 38 incident to the photodiode region at a large incidence angle leaks to pixels adjacent to the pixel of interest. In contrast, as illustrated in FIG. 1A, in the pixel structure according to this embodiment, since the whole photodiode region 7 is completely surrounded by the gate conductive layers 5a and 5b and the light-reflection conductive layers 9a and 9b, light incident to the photodiode region 7 at any angle can be prevented from leaking to adjacent pixels. This means that only by causing light beams incident from the microlens 11 to reach inside the fifth semiconductor P⁺-region 10, all the incident light beams can efficiently contribute to generation of signal charges. However, a light beam incident to the microlens 11 at a large incidence angle is reflected by the surface of the fifth semiconductor P⁺-region 10 and this does not contribute to generation of signal charges. In contrast, in the solid-state imaging device according to the seventh embodiment, as described below, all the light beams that are incident to the microlens 11 and are transmitted through the light-transmission intermediate region 24 are efficiently guided to the photodiode region 7.

As illustrated in FIG. 9, the angle θi orthogonal to each of the light beams 29a and 29b that are incident from the points 26a and 26b on the outer periphery of the microlens 11, that are transmitted through the centerline 27 of the microlens 11 and the light-transmission intermediate region 24, and that reach the points 28a and 28b on the outer periphery of the fifth semiconductor P⁺-region 10 and the surface of the fifth semiconductor P⁺-region 10 is smaller than the Brewster angle θb. The Brewster angle θb is represented by the following equation, where the refractive index of the light-transmission intermediate region 24 is denoted by $N_1$ and the refractive index of the fifth semiconductor P⁺-region 10 is denoted by $N_2$:

$$\theta b = \tan^{-1}(N_1/N_2).$$

When the angle θi described above is greater than the Brewster angle θb, the incident light beams that are incident from the microlens 11 and are transmitted through the light-transmission intermediate region 24 are completely reflected by the surface of the fifth semiconductor P⁺-region 10 and do not enter the fifth semiconductor P⁺-region 10. As described above, by setting the angle θi to be smaller than the Brewster angle θb, all the light beams that are incident to the microlens 11 and are transmitted through the light-transmission intermediate region 24 are efficiently guided to the photodiode region 7. Here, efficiently guiding light beams means that the light beams incident to the surface of the fifth semiconductor P⁺-region 10 are incident inside the fifth semiconductor P⁺-region 10 without being completely reflected. Consequently, the improvement in the sensitivity of the solid-state imaging device can be realized.

Embodiment 8

Hereinafter, a solid-state imaging device according to an eighth embodiment of the present invention will be described with reference to FIGS. 10A to 10E.

FIG. 10A illustrates a schematic three-dimensional structure diagram illustrating a state where an incident light beam 100 is incident to a gap $G_2$ extending in the row direction between the island-shaped semiconductors $P_{11}$ to $P_{33}$ each constituting a pixel in the first embodiment illustrated in FIG. 1B.

As illustrated in FIG. 10A, the light beam 100 incident from above is incident to the band-shaped signal line N⁺-region 2aa located below the island-shaped semiconductor P11. Part of the incident light beam 100 generates multiple reflected light beams 101a, 101b, 101c, and 101d inside the band-shaped signal line N⁺-region 2aa sandwiched between two insulating layers having different refractive indices and inside the band-shaped signal line N⁺-region 2bb adjacent to the band-shaped signal line N⁺-region 2aa (signal line semiconductor N⁺-regions $S_1$, $S_2$, and $S_3$). The multiple reflected light beams 101a, 101b, 101c, and 101d are incident to the photodiode region 7 (see FIG. 1A) of the island-shaped semiconductor $P_{12}$ constituting a pixel, which is adjacent to the island-shaped semiconductor $P_{11}$ constituting a pixel, and generate signal charges. The light leakage to the adjacent island-shaped semiconductor $P_{12}$ constituting a pixel causes a reduction in the resolution of the solid-state imaging device and color mixture in color imaging.

Figure 10B:
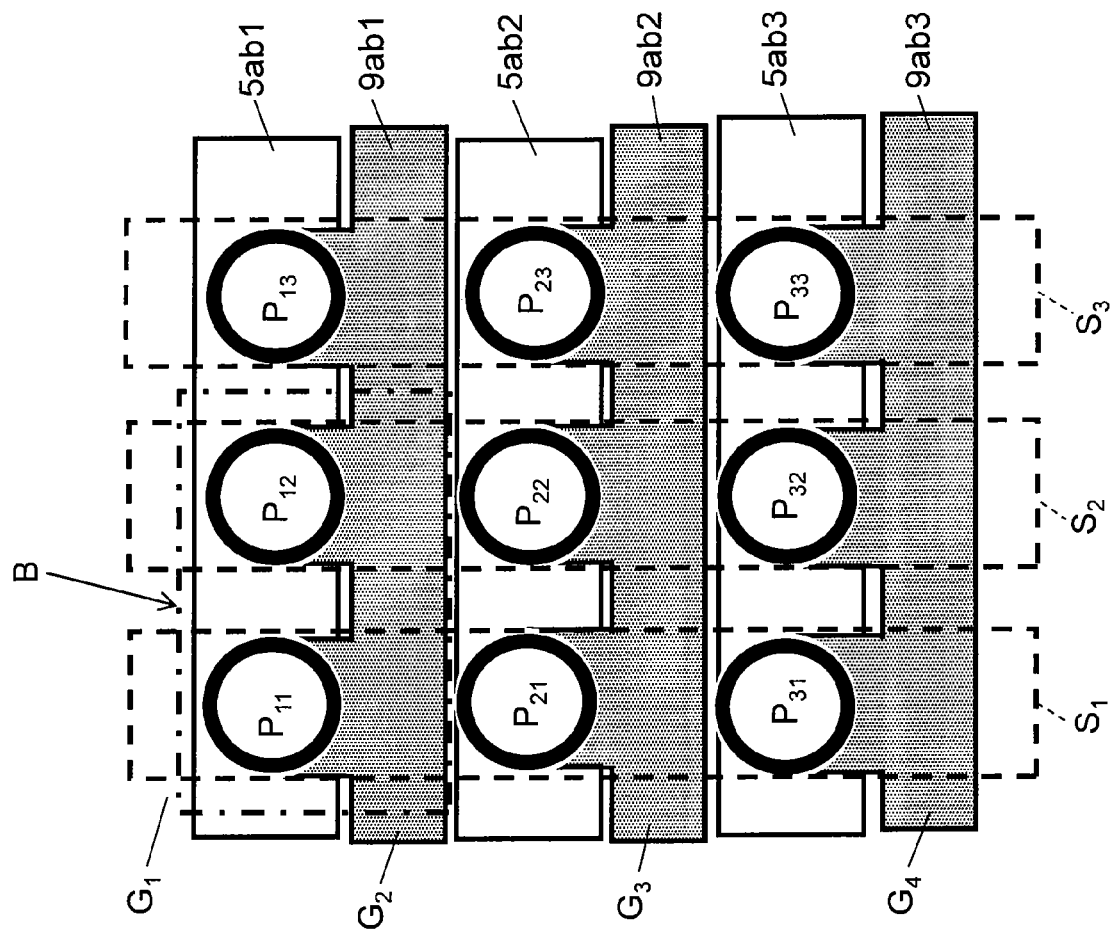
FIG. 10B is a schematic plan view of a solid-state imaging device according to an eighth embodiment of the present invention.

FIG. 10B illustrates a schematic plan view of the solid-state imaging device according to this embodiment when viewed from the light incidence surface side. As illustrated in FIG. 10B, the island-shaped semiconductors $P_{11}$ to $P_{33}$ each constituting a pixel are arranged in a square grid pattern or a rectangular grid pattern. The pixel-selecting lines 9ab1, 9ab2, and 9ab3 formed so as to extend in the horizontal direction in the drawing and the MOS gate wires 5ab1, 5ab2, and 5ab3 are arranged so as not to be superimposed on top of one other when viewed from above in the drawing. The pixel-selecting lines 9ab1, 9ab2, and 9ab3 are arranged within the gaps $G_1$, $G_2$, $G_3$, and $G_4$ formed between the MOS gate wires 5ab1, 5ab2, and 5ab3. With this arrangement, in the entire pixel region of the solid-state imaging device, light incident from the light exposure surface is blocked by the pixel-selecting lines 9ab1, 9ab2, and 9ab3. Thus, the incident light is prevented from directly reaching the signal line semiconductor $N^+$-regions $S_1$, $S_2$, and $S_3$ in which multiple reflection occurs. Consequently, in the solid-state imaging device according to this embodiment, the reduction in the resolution and color mixture in color imaging can be prevented.

FIG. 10C illustrates a schematic three-dimensional structure diagram in an area surrounded by the one-dot chain line in FIG. 10B. As illustrated in FIG. 10C, the pixel-selecting line 9ab1 connected to the light-reflection conductive layers 9aa and 9bb formed on the outer periphery of the island-shaped semiconductors $P_{11}$ and $P_{12}$ are formed. The pixel-selecting line 9ab1 is formed so as to extend in the horizontal direction in an area where the gap $G_2$ is formed. The other features of the structure are similar to those of the pixel structure illustrated in FIG. 1C. Thus, those similar parts will be referred to with the same reference numerals and signs and the explanations thereof will be omitted. When viewed from the light incidence surface side, since almost the entire area other than the island-shaped semiconductors $P_{11}$ and $P_{12}$ each including a photoelectric conversion unit is covered with the pixel-selecting line 9ab1 and the MOS gate wire 5ab, the incident light beam 100 does not leak inside an adjacent island-shaped semiconductor, unlike the pixel structure illustrated in FIG. 10A.

Figure 10D:
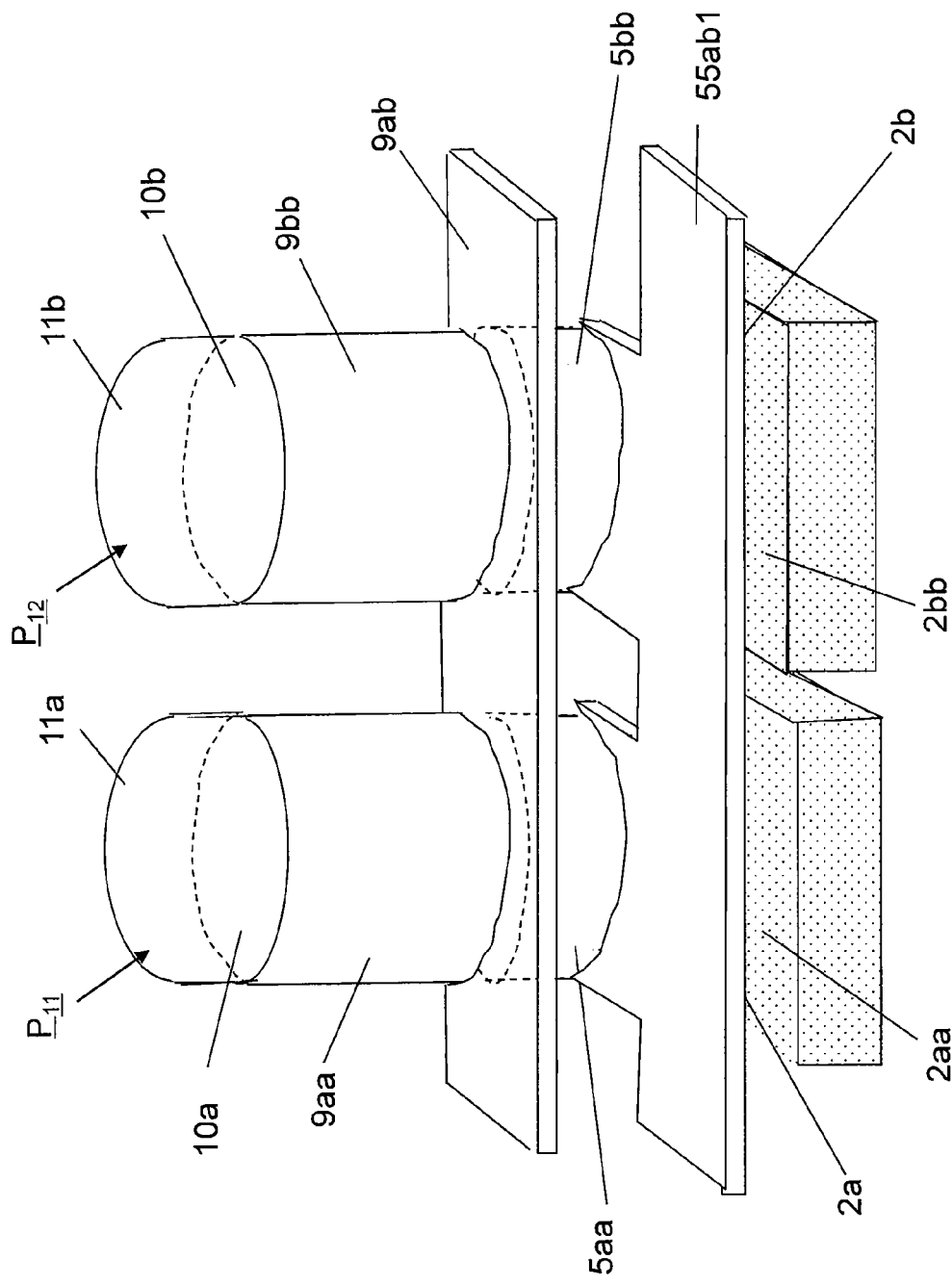
FIG. 10D is a schematic three-dimensional structure diagram illustrating the three-dimensional structure of adjacent two pixels (island-shaped semiconductors) in a solid-state imaging device according to a modification of the eighth embodiment.

FIG. 10D illustrates the schematic three-dimensional structure of a state where a MOS gate wire 55ab1 is provided in the area of the gap $G_2$ extending in the row direction between island-shaped semiconductors each constituting a pixel. The schematic three-dimensional structure illustrated in FIG. 10D is similar to the schematic three-dimensional structure illustrated in FIGS. 1C and 10A with the exception in that the MOS gate wire 55ab1 is provided. Also with the structure illustrated in FIG. 10D, since almost the entire area other than the island-shaped semiconductors $P_{11}$ and $P_{12}$ each in which a photoelectric conversion unit exists is covered with the pixel-selecting line 9ab and the MOS gate wire 55ab1 when viewed from the light incidence surface side as in the structure illustrated in FIG. 10C, the incident light beam 100 does not leak inside an adjacent island-shaped semiconductor, unlike the pixel structure illustrated in FIG. 10A.

Figure 10E:
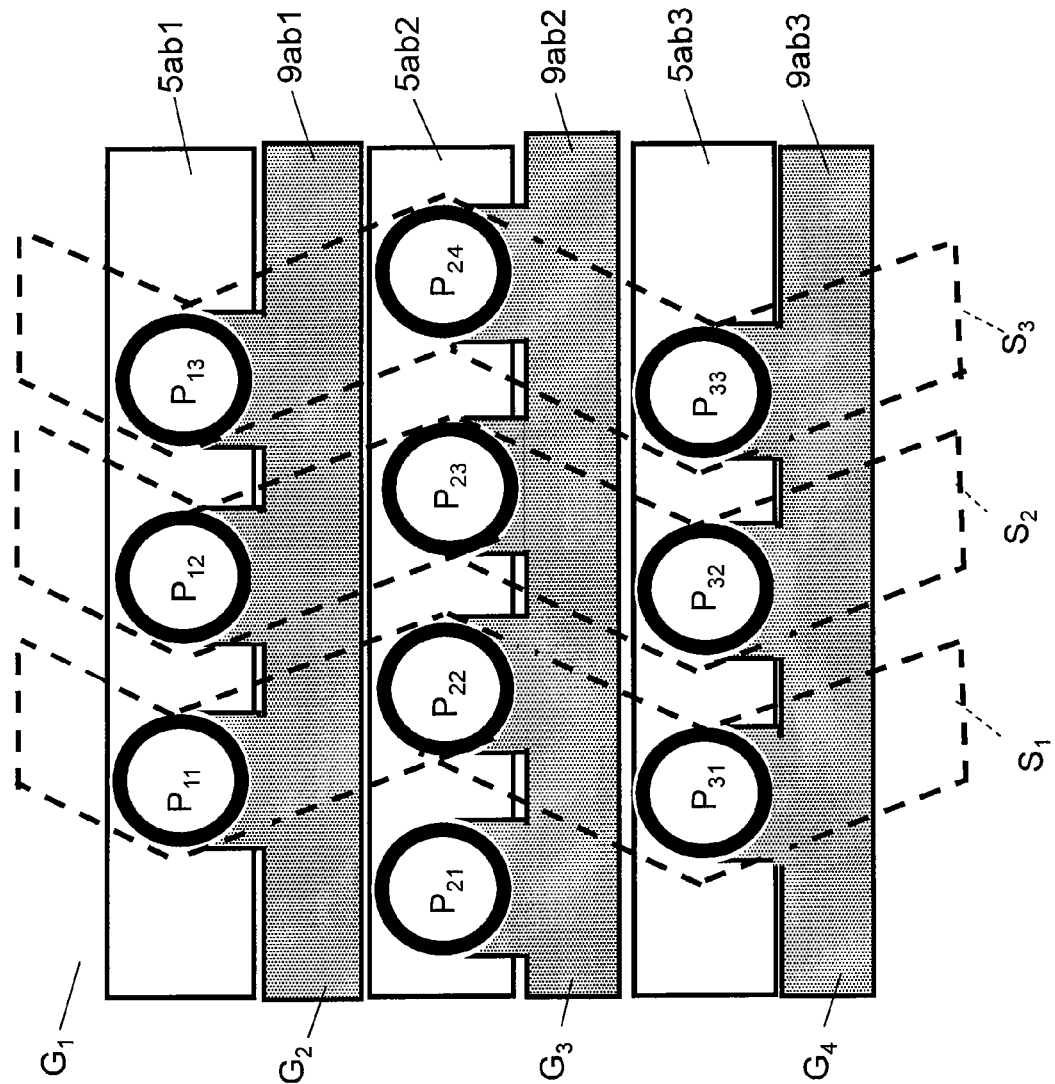
FIG. 10E is a schematic plan view of the solid-state imaging device according to another modification of the eighth embodiment when viewed from a light incidence surface side.

FIG. 10E is a plan view illustrating a solid-state imaging device according to a modification of this embodiment. As illustrated in FIG. 10E, the island-shaped semiconductors $P_{11}$ to $P_{33}$ each constituting a pixel are not arranged vertically in a line but arranged in a zigzag pattern. Since the island-shaped semiconductors $P_{11}$ to $P_{33}$ each constituting a pixel are arranged in the zigzag pattern, the signal line semiconductor $N^+$-regions $S_1$, $S_2$, and $S_3$ connect the individual island-shaped semiconductors $P_{11}$ to $P_{33}$ while vertically meandering in the zigzag pattern. As in FIG. 10B, the pixel-selecting lines 9ab1, 9ab2, and 9ab3 are arranged in the gaps $G_1$, $G_2$, $G_3$, and $G_4$ formed between the MOS gate wires 5ab1, 5ab2, and 5ab3. Thus, in the entire pixel region of the solid-state imaging device, the pixel-selecting lines 9ab1, 9ab2, and 9ab3 and the MOS gate wires 5ab1, 5ab2, and 5ab3 prevent incident light beams from directly reaching the signal line semiconductor $N^+$-regions $S_1$, $S_2$, and $S_3$ in which multiple reflection occurs. Consequently, in the solid-state imaging device according to this modification, the reduction in the resolution and color mixture in color imaging can be prevented.

Although, in FIGS. 10B and 10E, fine gaps are formed between the pixel-selecting lines 9ab1, 9ab2, and 9ab3 and the MOS gate wires 5ab1, 5ab2, and 5ab3 when viewed from the light incidence surface, the pixel-selecting lines 9ab1, 9ab2, and 9ab3 and the MOS gate wires 5ab1, 5ab2, and 5ab3 can be formed so as to be superimposed on top of one other. Thus, in the entire pixel region of the solid-state imaging device, prevention of incident light beams from directly reaching the signal line semiconductor $N^+$-regions $S_1$, $S_2$, and $S_3$ in which multiple reflection occurs can further be ensured by the pixel-selecting lines 9ab1, 9ab2, and 9ab3. Consequently, in the solid-state imaging device according to this modification, the reduction in the resolution and color mixture in color imaging can be prevented.

Embodiment 9

Hereinafter, a solid-state imaging device according to a ninth embodiment of the present invention will be described with reference to FIGS. 11A and 11B.

Figure 11A:
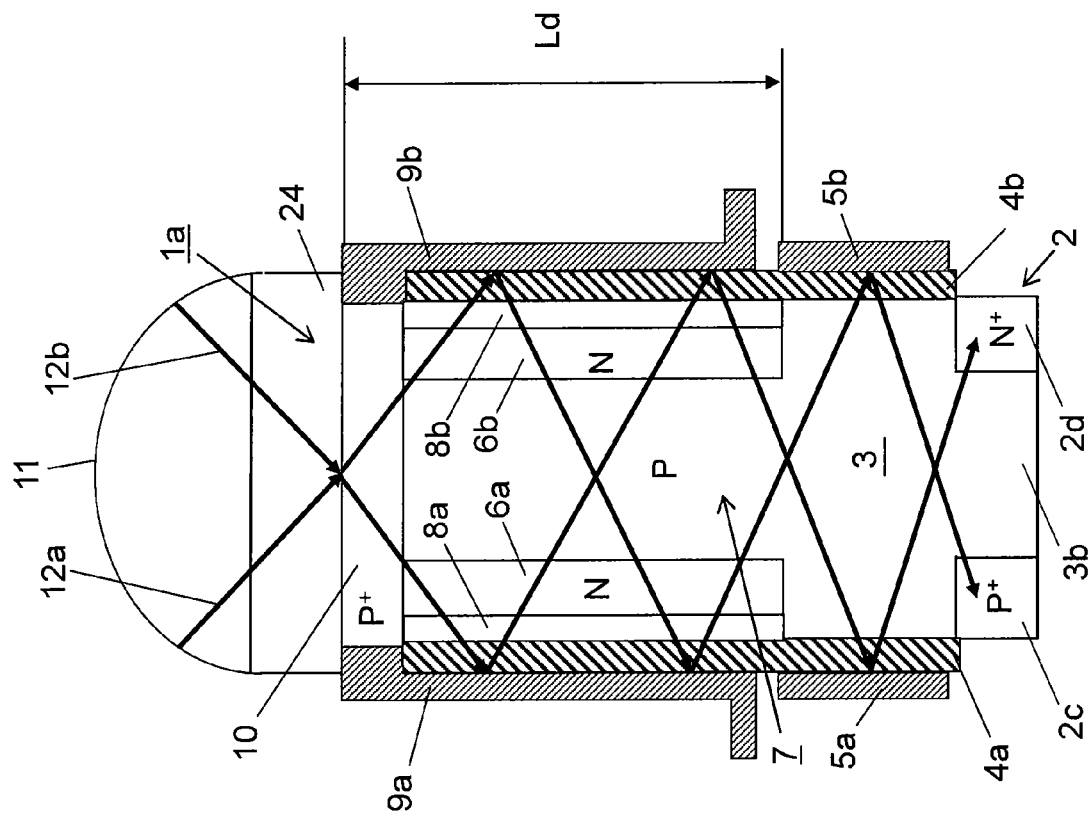
FIG. 11A is a cross-section diagram illustrating the pixel structure of a solid-state imaging device according to a ninth embodiment of the present invention.

FIG. 11A illustrates a cross-section diagram of the solid-state imaging device according to this embodiment. In the first embodiment illustrated in FIG. 1A, the first semiconductor $N^+$-region 2 is formed so as to cover the entire lower portion of the MOS transistor. In contrast, as illustrated in FIG. 11A, in this embodiment, the area where the first semiconductor $N^+$-region 2 is formed in the first embodiment includes a sixth semiconductor $P^+$-region 2c, a seventh semiconductor P-region 3b connected to the second semiconductor P-region 3, and an eighth semiconductor $N^+$-region 2d separated from the sixth semiconductor $P^+$-region 2c by the seventh semiconductor P-region 3b. In this pixel structure, the sixth semiconductor $P^+$-region 2c serves as a drain of a junction transistor functioning as a signal charge reading unit for reading signal charges stored in the photodiode region 7, and the eighth semiconductor $N^+$-region 2d serves as a drain of a MOS transistor functioning as a stored signal charge discharging unit for discharging the signal charges stored in the photodiode region 7. In this pixel structure, the sixth semiconductor $P^+$-region 2c and the eighth semiconductor $N^+$-region 2d are isolated from each other by the seventh semiconductor P-region 3b, which is connected to the second semiconductor P-region 3. Thus, the current path for the signal charge reading operation can be made different from the current path for the stored signal charge discharging operation. As a result, for example, advantages in an imaging operation, such as being capable of performing a high-speed shutter operation at a signal charge reading timing and a stored signal charge discharging timing that are independent from each other in terms of time course.

Figure 11B:
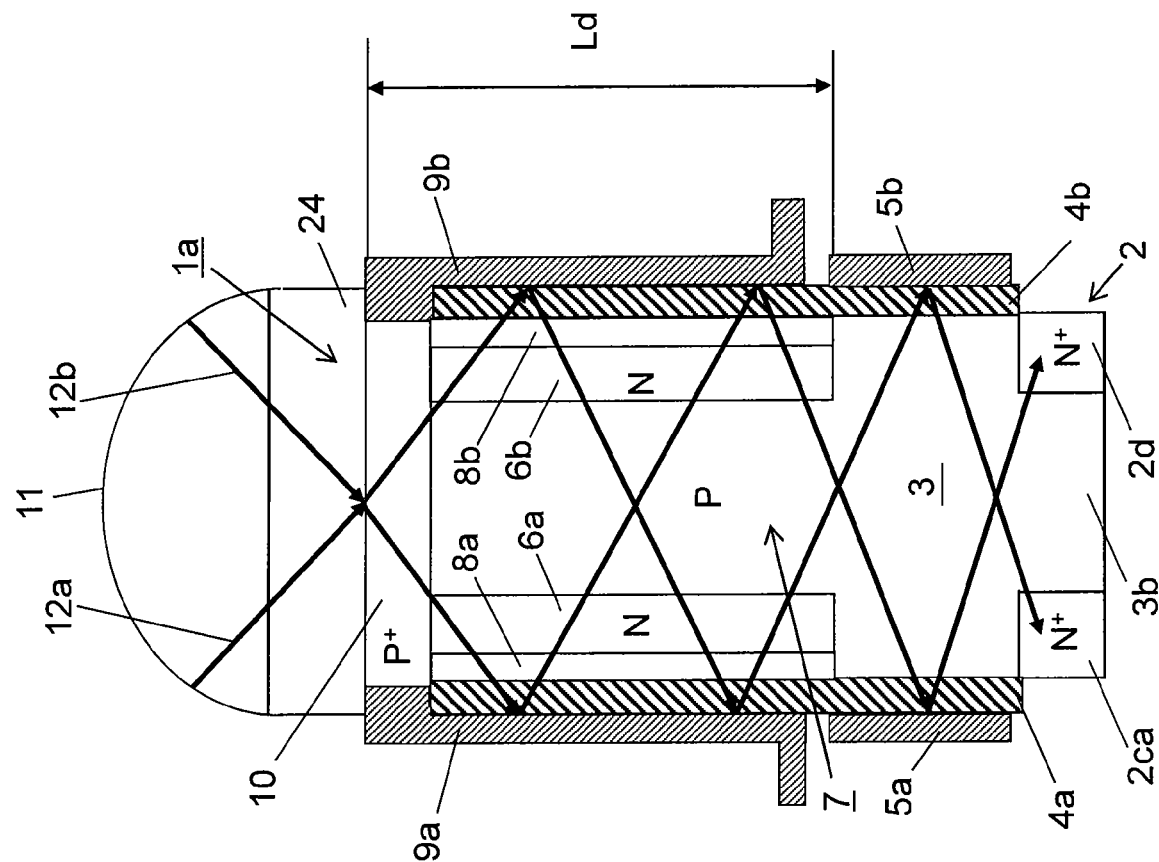
FIG. 11B is a cross-section diagram illustrating the pixel structure of a solid-state imaging device according to a modification of the ninth embodiment.

In addition, in FIG. 11A, even when the sixth semiconductor $P^+$-region 2c of the junction transistor is replaced with a ninth semiconductor $N^+$-region 2ca as in the pixel structure of a solid-state imaging device according to a modification of this embodiment illustrated in FIG. 11B, a similar imaging operation can be achieved. In this case, a lower area of the first semiconductor $N^+$-region 2 near the ninth semiconductor $N^+$-region 2ca serves as a source of the junction transistor functioning as a signal charge reading unit.

In the embodiments described above, the pixel structure of a solid-state imaging device and the imaging operation thereof have been explained by using one pixel, two pixels, or 3×3 (=9) pixels arranged in a pixel region. Obviously, however, not limited to this, the technical idea of the present invention is applicable to a solid-state imaging device in which any other number of pixels are one-dimensionally or two-dimensionally arranged in a pixel region.

In the embodiments described above, a pixel structure is provided in which the island-shaped semiconductor 1a includes the photodiode region 7 serving as a photoelectric conversion unit, the third semiconductor N-regions 6a and 6b serving as a signal charge storing unit, a junction transistor serving as a signal charge reading unit, and a MOS transistor serving as a stored signal charge discharging unit. Obviously, however, a structure in which the photoelectric conversion unit, the signal charge storing unit, the signal charge reading unit, and the stored signal charge discharging unit are arranged inside the island-shaped semiconductor with a different configuration is also included in the technical idea of the present invention.

In the embodiments described above, the structure of the island-shaped semiconductors 1a and P11 to P33 each constituting a pixel has a column shape. However, not limited to this, the structure may have a square column shape or a polygonal column shape.

In the embodiments described above, the first semiconductor $N^+$-region 2 and the third semiconductor N-regions 6a and 6b have an N-conductivity type, the second semiconductor P-region 3 has a P-conductivity type, and the fourth semiconductor $P^+$-regions 8a and 8b and the fifth semiconductor $P^+$-region 10 have a P-conductivity type. However, not limited to this, the first semiconductor region 2 and the third semiconductor regions 6a and 6b may have a P-conductivity type, the second semiconductor region 3 may have an N-conductivity type, and the fourth semiconductor regions 8a and 8b and the fifth semiconductor region 10 may have an $N^+$-conductivity type. In this case, in the fourth semiconductor $N^+$-region having an $N^+$-conductivity type, a large number of electrons whose polarity opposite to that of positive holes, which are signal charges, are stored. In this case, when electrons located in the valence band are thermally excited by a conduction-band at the energy level within a forbidden band at the phase boundary between the insulating layer 4a and the fourth semiconductor $N^+$-region having the $N^+$-conductivity type, positive holes causing dark current are generated. The positive holes are recombined with electrons existing in the fourth semiconductor $N^+$-region having the $N^+$-conductivity type and disappear. Thus, positive holes causing dark current are not mixed into signal charges Qsig, and no dark current or dark current noise is generated.

In the embodiments described above, the channel of the MOS transistor is formed in the second semiconductor P-region 3 by an electric field (enhancement-type). However, not limited to this, the channel of the MOS transistor may be formed, for example, by depression-type in which impurities are injected into the second semiconductor P-region 3 by ion injection or the like or by built-in channel.

In the embodiments described above, the light-transmission intermediate region 24 has a single-layer configuration. However, the light-transmission intermediate region may be formed of a plurality of layers. Furthermore, a color-filter layer may be included in the light-transmission intermediate region 24.

In the embodiments described above, the gate conductive layers 5a and 5b and the light-reflection conductive layers 9a, 9b, 99a, and 99b are each formed of a single-layer metal film. However, they may be each formed of a multi-layer metal film. In addition, the gate conductive layers 5a and 5b and the light-reflection conductive layers 9a, 9b, 99a, and 99b are not necessarily made of metal. They may be formed by causing a material layer, such as polycrystalline Si in which impurities are doped and silicide that reflects long-wavelength light, to be contained in part of metal or may be formed only of polycrystalline Si in which impurities are doped or silicide.

In FIGS. 1B, 2F, 10B, and 10E, $S_1$, $S_2$, and $S_3$ including signal lines are semiconductor N+-regions. However, not limited to this, in a case where, the light-reflection conductive layer 14b made of metal is directly formed below the first semiconductor $N^+$-region 2 without providing an insulating layer therebetween as illustrated in FIG. 5B, since the light-reflection conductive layer 14b causes the resistances of the signal lines $S_1$, $S_2$, and $S_3$ to be reduced, the signal lines $S_1$, $S_2$, and $S_3$ are not necessarily semiconductor $N^+$-regions. Also in this case, the light beam 100 that is incident to the gaps $G_1$, $G_2$, $G_3$, and $G_4$ illustrated in FIG. 2F is reflected by the light-reflection conductive layer 14b, and leakage of part of the light beam 100 to the photodiode region 7 of a pixel (island-shaped semiconductor) adjacent to the pixel of interest (island-shaped semiconductor 1a) can be prevented.

In the embodiments described above, the light-reflection conductive layers 14a and 14b reflect electromagnetic energy waves such as light, which is one type of electromagnetic wave. However, the light-reflection conductive layers may be electromagnetic-wave-reflection conductive layers having a function of reflecting other types of electromagnetic energy wave, such as infrared rays, visible rays, ultraviolet rays, X-rays, gamma-rays, and electron rays, in accordance with the purpose of the usage of the solid-state imaging device.

The present application is based on International Patent Application No. PCT/JP 2010/69384 filed Oct. 29, 2010, the entire description, claims, and drawings of which are incorporated herein by reference.

In addition, various embodiments and modifications can be made to the present invention without departing from the spirit and scope of the present invention in a broad sense. Furthermore, the embodiments described above are provided for merely explaining exemplary embodiments and do not limit the scope of the present invention.

The present invention is applicable to a semiconductor device including a transistor in which a channel region thereof is formed in a semiconductor having a column-shaped structure.

What is claimed is:

1. A solid-state imaging device in which a plurality of pixels are two-dimensionally arranged,
   a plurality of island-shaped semiconductors constituting the plurality of pixels being formed on a substrate, wherein:
   the plurality of island-shaped semiconductors each comprises
   a first semiconductor region formed in a lower area of the island-shaped semiconductor,
   a second semiconductor region formed on the first semiconductor region and having a conductivity type opposite to a conductivity type of the first semiconductor region or being an intrinsic semiconductor, a third semiconductor region formed on an upper lateral side of the second semiconductor region and having a conductivity type the same as the conductivity type of the first semiconductor region, a fourth semiconductor region formed on an outer periphery of the third semiconductor region and having a conductivity type opposite to the conductivity type of the first semiconductor region, an insulating layer formed on an outer periphery of the fourth semiconductor region and a lower lateral side of the second semiconductor region, a conductive layer formed on an outer periphery of the insulating layer and functioning as a gate electrode forming a channel in a lower area of the second semiconductor region, a reflection conductive layer formed on an outer periphery of the third semiconductor region, the fourth semiconductor region, and the insulating layer and reflecting an electromagnetic energy wave, a fifth semiconductor region formed over the second semiconductor region and the third semiconductor region and having a conductivity type the same as the conductivity type of the fourth semiconductor region, and a microlens formed over the fifth semiconductor region and whose focal point is located in a portion near an upper surface of the fifth semiconductor region;

the island-shaped semiconductor includes a portion functioning as a photoelectric conversion unit, a portion functioning as a signal charge storing unit, a portion functioning as a signal charge reading unit, and a portion functioning as a stored signal charge discharging unit;

the photoelectric conversion unit includes a photodiode region including the second semiconductor region and the third semiconductor region and an electromagnetic energy wave incident to the microlens generates signal charges in the photoelectric conversion unit;

the signal charge storing unit includes the third semiconductor region and stores the signal charges generated in the photoelectric conversion unit;

the signal charge reading unit includes a junction transistor in which each of the fifth semiconductor region and a lower area of the second semiconductor region serves as a drain or a source and the signal charge storing unit serves as a gate, and functions to read as an output signal a drain-source current which flows between the drain and the source of the junction transistor and changes in accordance with the amount of signal charges stored in the signal charge storing unit; and the stored signal charge discharging unit includes a MOS transistor in which the first semiconductor region serves as a drain, the conductive layer serves as a gate, the third semiconductor region serves as a source, and a portion of the second semiconductor region that is sandwiched between the first semiconductor region and the third semiconductor region serves as a channel, and functions to apply a certain voltage to the conductive layer to discharge the signal charges stored in the signal charge storing unit to the first semiconductor region.

2. The solid-state imaging device according to claim 1, wherein:
an imaging operation performed by the solid-state imaging device includes
a signal charge storing operation for storing the signal charges generated in the photoelectric conversion unit in the third semiconductor region,
a signal charge reading operation for reading as an output signal the drain-source current of the junction transistor in accordance with the amount of signal charges stored in the third semiconductor region, and
a stored signal charge discharging operation for applying the certain voltage to the conductive layer to discharge the signal charges stored in the third semiconductor region to the first semiconductor region; and
at the time of each of the signal charge storing operation, the signal charge reading operation, and the stored signal charge discharging operation, electric charges having a polarity opposite to a polarity of the signal charges are stored in the fourth semiconductor region.

3. The solid-state imaging device according to claim 1, wherein a sixth semiconductor region having a conductivity type the same as the conductivity type of the second semiconductor region or a ninth semiconductor region having a conductivity type opposite to the conductivity type of the second semiconductor region, a seventh semiconductor region having a conductivity type the same as the conductivity type of the second semiconductor region and connected to the second semiconductor region, and an eighth semiconductor region having a conductivity type opposite to the conductivity type of the second semiconductor region are provided instead of the first semiconductor region, the sixth semiconductor region and a lower area of the second semiconductor region near the ninth semiconductor region serve as a drain and a source of the junction transistor, respectively, and the eighth semiconductor region serves as a drain of the MOS transistor.

4. The solid-state imaging device according to claim 1, wherein a reflection layer formed on a lower side of the island-shaped semiconductor is provided.

5. The solid-state imaging device according to claim 1, wherein:
a light-transmission insulating layer formed on a lower side of the island-shaped semiconductor and a light-absorption layer formed on a lower side of the light-transmission insulating layer are further provided; and
the thickness of the light-transmission insulating layer is set in such a manner that the reflectivity of light that is incident from the microlens, that is reflected by the conductive layer and the reflection conductive layer, that is transmitted through the first to fifth semiconductor regions, and that reaches the light-transmission insulating layer is relatively increased for a case of green light and is relatively decreased for a case of red light.

6. The solid-state imaging device according to claim 1, wherein:
a light-transmission insulating layer formed on a lower side of the island-shaped semiconductor and a light-absorption layer formed on a lower side of the light-transmission insulating layer are further provided; and
the thickness of the light-transmission insulating layer is set in such a manner that the reflectivity of light that is incident from the microlens, that is reflected by the conductive layer and the reflection conductive layer, that is transmitted through the first to fourth semiconductor regions, and that reaches the light-transmission insulating layer is relatively increased for cases of green light and red light.

7. The solid-state imaging device according to claim 1, wherein:
a light-transmission intermediate layer formed between the microlens and the island-shaped semiconductor is provided; and
the focal point of the microlens is located inside the light-transmission intermediate layer.

8. The solid-state imaging device according to claim 1, wherein:
  a recessed portion or a protruding portion is formed in a central surface portion of the island-shaped semiconductor; and
  the refractive indices of two material regions being in contact with each other across a recessed surface of the recessed portion or a protruding surface of the protruding portion as a boundary surface differ from each other.

9. The solid-state imaging device according to claim 1, wherein:
  a light-transmission intermediate layer formed between the microlens and the island-shaped semiconductor is provided; and
  an angle θi formed between a light beam that is incident from a point on an outer periphery of the microlens, that is transmitted through a centerline of the microlens and the light-transmission intermediate layer, and that reaches a point on an outer periphery of an upper area of the island-shaped semiconductor and a line that is orthogonal to an upper surface of the fifth semiconductor region is smaller than a Brewster angle θb ($=\tan^{-1}(N_1/N_2)$; here, $N_1$: the refractive index of the light-transmission intermediate layer, $N_2$: the refractive index of the fifth semiconductor region).

10. The solid-state imaging device according to claim 1, wherein:
  the plurality of pixels are arranged in a square grid pattern, a rectangular grid pattern, or a zigzag pattern;
  a plurality of conductive wires that electrically connect the first semiconductor regions in pixels arranged in a vertical direction among the plurality of pixels and that extend in the vertical direction,
  a plurality of conductive wires that electrically connect the conductive layers in pixels arranged in a horizontal direction among the plurality of pixels and that extend in the horizontal direction, and
  a plurality of reflection conductive wires that electrically connect the reflection conductive layers in pixels arranged in the horizontal direction among the plurality of pixels and that extend in the horizontal direction, are further provided; and
  the conductive wires extending in the horizontal direction and the reflection conductive wires are not superimposed on top of one other when viewed in a direction of application of electromagnetic energy waves to the plurality of pixels and are arranged alternately in the vertical direction.

11. The solid-state imaging device according to claim 1, wherein the reflection conductive layer in each of the plurality of pixels is electrically isolated from the fifth semiconductor region in the corresponding pixel, and all the reflection conductive layers in the plurality of pixels are connected to each other so as to cover a pixel region where the plurality of pixels are arranged.

* * * * *